United States Patent
Lim et al.

(10) Patent No.: US 9,343,355 B2
(45) Date of Patent: May 17, 2016

(54) WIRING STRUCTURES INCLUDING SPACERS AND AN AIRGAP DEFINED THEREBY, AND METHODS OF MANUFACTURING THE SAME

(71) Applicant: Samsung Electronics Co., Ltd., Suwon-Si, Gyeonggi-Do (KR)

(72) Inventors: Chae-Ho Lim, Seoul (KR); Bo-Young Song, Seongnam-si (KR); Cheol-Ju Yun, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 7 days.

(21) Appl. No.: 14/197,729

(22) Filed: Mar. 5, 2014

(65) Prior Publication Data

US 2014/0264953 A1    Sep. 18, 2014

(30) Foreign Application Priority Data

Mar. 14, 2013    (KR) .................. 10-2013-0027272

(51) Int. Cl.
*H01L 21/768* (2006.01)
*H01L 23/528* (2006.01)
*H01L 23/522* (2006.01)
(Continued)

(52) U.S. Cl.
CPC ...... *H01L 21/7682* (2013.01); *H01L 21/76897* (2013.01); *H01L 23/5222* (2013.01); *H01L 23/53295* (2013.01); *H01L 27/10885* (2013.01); *H01L 2924/0002* (2013.01)

(58) Field of Classification Search
CPC .................. H01L 21/76837; H01L 21/76895; H01L 23/528; H01L 23/5222; H01L 23/53295; H01L 21/7682; H01L 2924/0002; H01L 27/10885; H01L 2924/00; H01L 21/768
USPC .......... 257/786, E21.258, E21.231, 288, 741, 257/751, 289, 755, 332, E29.262; 438/586, 438/671, 696, 689, 700, 737, 738, 694, 300, 438/655
See application file for complete search history.

(56) References Cited

U.S. PATENT DOCUMENTS

| | | |
|---|---|---|
| 5,736,446 A | 4/1998 | Wu |
| 5,770,507 A | 6/1998 | Chen et al. |
| 6,486,025 B1 | 11/2002 | Liu et al. |

(Continued)

FOREIGN PATENT DOCUMENTS

| | | |
|---|---|---|
| KR | 0549576 | 2/2005 |
| KR | 0672823 | 1/2007 |
| KR | 0900237 | 5/2009 |

*Primary Examiner* — Alexander Oscar Williams
(74) *Attorney, Agent, or Firm* — Harness, Dickey & Pierce, P.L.C.

(57) ABSTRACT

A method of manufacturing a wiring structure may include forming a first conductive pattern on a substrate, forming a hardmask on the first conductive pattern, forming a first spacer on sidewalls of the first conductive pattern and the hardmask, forming a first sacrificial layer pattern on a sidewall of the first spacer, forming a second spacer on a sidewall of the first sacrificial layer pattern, removing the first sacrificial layer pattern, and forming a third spacer on the second spacer, may be provided. The third spacer may contact an upper portion of the sidewall of the first spacer and define an air gap in association with the first and second spacers. The first spacer has a top surface substantially higher than a top surface of the first conductive pattern. The second spacer has a top surface substantially lower than the top surface of the first spacer.

16 Claims, 19 Drawing Sheets

(51) Int. Cl.
  *H01L 23/532* (2006.01)
  *H01L 27/108* (2006.01)

(56) References Cited

U.S. PATENT DOCUMENTS

| | | | |
|---|---|---|---|
| 6,492,245 | B1 | 12/2002 | Liu et al. |
| 7,566,656 | B2 | 7/2009 | Liu et al. |
| 7,871,923 | B2 | 1/2011 | Liu et al. |
| 2007/0096202 | A1 | 5/2007 | Kang et al. |
| 2008/0237663 | A1* | 10/2008 | Hanafi .......................... 257/289 |
| 2009/0004867 | A1* | 1/2009 | Yune ............................. 438/696 |
| 2009/0111270 | A1* | 4/2009 | Choi ............................. 438/694 |
| 2010/0244255 | A1 | 9/2010 | Lee |
| 2010/0285662 | A1 | 11/2010 | Kim et al. |
| 2010/0327346 | A1* | 12/2010 | Jeong et al. ................... 257/332 |
| 2013/0214413 | A1* | 8/2013 | Lee et al. ...................... 257/741 |
| 2014/0061922 | A1* | 3/2014 | Lee et al. ...................... 257/755 |
| 2014/0264479 | A1* | 9/2014 | Cai et al. ....................... 257/288 |
| 2014/0327054 | A1* | 11/2014 | Adam et al. ................... 257/288 |
| 2015/0061134 | A1* | 3/2015 | Lee et al. ...................... 257/751 |

* cited by examiner

FIRST
DIRECTION    SECOND
   ⊗————— DIRECTION

FIRST
DIRECTION    SECOND
   ⊗————— DIRECTION

WIRING STRUCTURES INCLUDING SPACERS AND AN AIRGAP DEFINED THEREBY, AND METHODS OF MANUFACTURING THE SAME

CLAIM OF PRIORITY

This application claims priority under 35 USC §119 to Korean Patent Application No. 2013-0027272, filed on Mar. 14, 2013 in the Korean Intellectual Property Office (KIPO), the contents of which are herein incorporated by reference in their entirety.

BACKGROUND

1. Field

Example embodiments relate to wiring structures, methods of manufacturing wiring structures, and/or methods of manufacturing semiconductor devices.

2. Description of the Related Art

Recently, as the integration degree of a semiconductor device increases, a space between wirings, e.g., bit lines, has been decreased. Accordingly, a parasitic capacitance between the wirings has been increased, thereby degrading the electrical characteristics of the semiconductor device. As such, wirings structures and/or methods of manufacturing wiring structures to reduce the parasitic capacitance between the wirings are being actively researched.

SUMMARY

Example embodiments provide wiring structures having a reduced parasitic capacitance.

Example embodiments provide methods of manufacturing a wiring structure having a reduced parasitic capacitance.

Example embodiments provide methods of manufacturing a semiconductor device including a wiring structure having a reduced parasitic capacitance.

According to example embodiments, a method of manufacturing a wiring structure may include a first conductive pattern is formed on a substrate. A hardmask is formed on the first conductive pattern. A first spacer is formed on sidewalls of the first conductive pattern and the hardmask. The first spacer has a top surface substantially higher than a top surface of the first conductive pattern. A first sacrificial layer pattern is formed on a sidewall of the first spacer. A second spacer is formed on a sidewall of the first sacrificial layer pattern. The second spacer has a top surface substantially lower than the top surface of the first spacer. The first sacrificial layer pattern is removed to define an air gap. A third spacer is formed on the second spacer to cover the air gap. The third spacer contacts the sidewall of the first spacer.

Forming the first sacrificial layer pattern may include forming a preliminary first sacrificial layer pattern on the sidewall of the first spacer, forming a second sacrificial layer pattern covering a lower portion of a sidewall of the preliminary first sacrificial layer pattern and removing a portion of the preliminary first sacrificial layer pattern exposed by the second sacrificial layer pattern.

The second sacrificial layer pattern may include a material having an etch selectivity with respect to the first spacer and the first sacrificial layer pattern.

Forming the second spacer may include forming a second spacer layer on a top surface and the sidewall of the first sacrificial layer pattern and removing a portion of the second spacer layer on the top surface of the first sacrificial layer pattern.

Forming the second spacer may include forming a second spacer layer on the sidewall of the first sacrificial layer pattern, forming a second conductive pattern covering a lower portion of a sidewall of the second spacer layer, and removing a portion of the second spacer layer exposed by the second conductive pattern.

Removing the portion of the second spacer layer and removing the first sacrificial layer pattern may be performed simultaneously.

The first sacrificial layer pattern may include a material having an etch selectivity with respect to the first spacer and the second spacer.

A height of the first spacer may be substantially equal to a sum of heights of the second spacer and the third spacer.

According to example embodiments, a wiring structure may include a conductive pattern in the substrate, a hardmask on the conductive pattern, a first spacer on sidewalls of the conductive pattern and the hardmask, a second spacer spaced apart from the first spacer, and a third spacer contacting a sidewall of the first spacer and the top surface of the second spacer to define an air gap. The first spacer may have a top surface substantially higher than a top surface of the first conductive pattern. The second spacer may have a top surface substantially lower than the top surface of the first spacer.

A height of the first spacer may be substantially equal to a sum of heights of the second spacer and the third spacer.

The air gap may be defined by the sidewall of the first spacer, a sidewall of the second spacer, and a bottom surface of the third spacer According to example embodiments, a method of manufacturing a semiconductor device may include forming a gate insulation layer pattern and a gate electrode extending in a first direction substantially parallel to a top surface of a substrate, the gate insulation layer pattern and the gate electrode buried at an upper portion of the substrate, forming a first conductive pattern on the substrate, the first conductive pattern extending in a second direction substantially perpendicular to the first direction, forming a hardmask on the first conductive pattern, forming a first spacer on sidewalls of the first conductive pattern and the hardmask, the first spacer having a top surface substantially higher than a top surface of the first conductive pattern, forming a first sacrificial layer pattern on a sidewall of the first spacer, forming a second spacer on a sidewall of the first sacrificial layer pattern, the second spacer having a top surface substantially lower than the top surface of the first spacer, removing the first sacrificial layer pattern is removed, and forming a third spacer on the second spacer, the third spacer contacting an upper portion of the sidewall of the first spacer and defining an air gap in association with the first and second spacers.

Forming the first sacrificial layer pattern may include forming a preliminary first sacrificial layer pattern on the sidewall of the first spacer, forming a second sacrificial layer pattern covering a lower portion of a sidewall of the preliminary first sacrificial layer pattern, and removing a portion of the preliminary first sacrificial layer pattern exposed by the second sacrificial layer pattern. Forming the second spacer may include forming a second spacer layer on a top surface and the sidewall of the first sacrificial layer pattern, and removing a portion of the second spacer layer on the top surface of the first sacrificial layer pattern.

Forming the second spacer may include forming a second spacer layer on the sidewall of the first sacrificial layer pattern, forming a second conductive pattern covering a lower portion of a sidewall of the second spacer layer, and removing a portion of the second spacer layer exposed by the second conductive pattern.

The method further includes forming a second conductive pattern filling a space between the second spacers before defining the air gap, and forming a capacitor electrically connected to the second conductive pattern after forming the third spacer.

According to example embodiments, a method of manufacturing a wiring structure may include forming a first conductive pattern on a substrate, forming a hardmask on the first conductive pattern, forming a first spacer on sidewalls of the first conductive pattern and the hardmask, the first spacer having a top surface substantially higher than a top surface of the first conductive pattern, forming a second spacer spaced apart from the first spacer, the second spacer having a top surface substantially lower than the top surface of the first spacer, and forming a third spacer on the second spacer to define an air gap enclosed by the first, second, and third spacers on the substrate.

Forming the third spacer may form the third spacer to contact an upper portion of the sidewall of the first spacer.

Forming the third spacer may define the air gap enclosed by a sidewall of the first spacer, a sidewall of the second spacer, a bottom surface of the third spacer.

Forming the third spacer may define the air gap enclosed by a sidewall of the first spacer, a sidewall of the second spacer, a bottom surface of the third spacer, and an upper surface of the substrate.

Forming the third spacer may form the third spacer having a height substantially corresponding to a difference between heights of the first spacer and the second spacer.

According to example embodiments, an air gap may be defined by a sidewall of a first spacer, a sidewall of a second spacer and a bottom surface of a third spacer. The first spacer and the second spacer may have different height, and the third spacer may have a height corresponding to the difference between heights of the first spacer and the second spacer. Therefore, the third spacer may have a sufficient height. Thus, the third spacer above the air gap may not be easily damaged or broken.

BRIEF DESCRIPTION OF THE DRAWINGS

Example embodiments will be more clearly understood from the following detailed description taken in conjunction with the accompanying drawings.

FIG. 1 is a cross-sectional view illustrating a wiring structure in accordance with example embodiments;

FIGS. 2 to 12 are cross-sectional views illustrating a method of manufacturing a wiring structure in accordance with some example embodiments;

FIGS. 13 to 17 are cross-sectional views illustrating a method of manufacturing a wiring structure in accordance with some example embodiments;

FIGS. 18 to 20 are cross-sectional views illustrating a method of manufacturing a wiring structure in accordance with some example embodiments;

FIGS. 21 to 34 are plan views and cross-sectional views illustrating a method of manufacturing a semiconductor device in accordance with some example embodiments; and FIG. 35 is a block diagram illustrating a system including the semiconductor device according to example embodiments.

DETAILED DESCRIPTION OF EXAMPLE EMBODIMENTS

Figure 1:
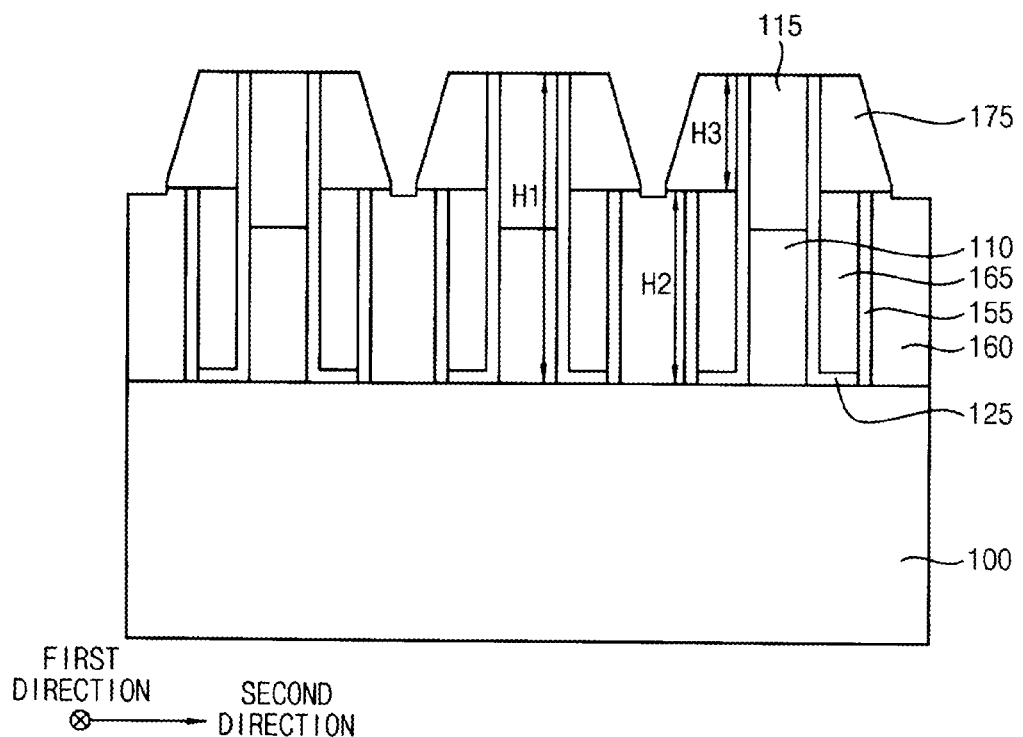
FIGS. 1 to 35 represent non-limiting, example embodiments as described herein.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this description will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a cross-sectional view illustrating a wiring structure in accordance with example embodiments.

Referring to FIG. 1, the wiring structure may include a first conductive pattern 110, a hardmask 115, a first spacer 125, a second spacer 155 and a third spacer 175, which are disposed on a substrate 100. Further, an air gap 165 may be defined and surrounded by the first spacer 125, the second spacer 155 and the third spacer 175.

The substrate 100 may include a semiconductor substrate, e.g., a silicon substrate, a germanium substrate. a silicon-germanium substrate, a silicon-on-insulator (SOI) substrate, or a germanium-on-insulator (GOI) substrate.

The first conductive pattern 110 may be disposed on the substrate 100. For example, the first conductive pattern 110 may include, e.g., doped polysilicon, a metal, a metal nitride, a metal silicide, etc. In example embodiments, a plurality of first conductive patterns 110 may be arranged in a second direction substantially parallel to a top surface of the substrate 100. Each of the first conductive patterns 110 may extend in a first direction substantially perpendicular to the second direction.

The hardmask 115 may be disposed on the first conductive pattern 110. For example, the hardmask 115 may include an insulation material, e.g., silicon nitride. The hardmask 115 may have a width substantially equal to that of the first conductive pattern 110. In example embodiments, the hardmasks 115 may be disposed on corresponding first conductive patterns 110.

In this case, a first height H1 may be defined as a distance from the top surface of the substrate 100 to a top surface of the hardmask 115. For example, the first height H1 may be substantially equal to a sum of heights of the first conductive pattern 110 and the hardmask 115.

The first spacer 125 may be disposed on sidewalls of the first conductive pattern 110 and the hardmask 115. For example, the first spacer 125 may include an insulation material, e.g., silicon nitride.

The first spacer 125 may have a top surface which may be substantially higher than a top surface of the first conductive pattern 110 and may be substantially equal to or lower than the top surface of the hardmask 115. In example embodiments, the first spacer 125 may have a height substantially equal to a sum of heights of the first conductive pattern 110 and the hardmask 115. The first spacer 125 may have the first height H1 from the top surface of the substrate 100.

The second spacer 155 may be spaced apart from the first spacer 125 in the second direction. Further, the second spacer 155 may include a material substantially the same as that of the first spacer 125.

The second spacer 155 may have a top surface which may be substantially lower than the top surface of the first spacer 125, and may be substantially higher than the top surface of the first conductive pattern 110. The second spacer 155 may have a second height H2 from the top surface of the substrate 100.

The third spacer 175 may be disposed on the second spacer 155 such that the third spacer 175 may directly contact a sidewall of the first spacer 125. In example embodiments, the third spacer 175 may have a third height H3, and may have a top surface substantially equal to the top surface of the hardmask 115. Thus, the third height H3 of the third spacer 175 may substantially correspond to a difference between the first height H1 of the first spacer 125 and the second height H2 of the second spacer 155. The third height H3 of the third spacer 175 may be at least two times larger than a thickness of the first spacer 125 or the second spacer 155. Accordingly, the third spacer 175 disposed on the air gap 165 may not be easily damaged or broken.

In example embodiments, the third spacer 175 may include a material substantially the same as or similar to those of the first spacer 125 or the second spacer 155.

As mentioned above, the air gap 165 may be a void defined by and between the first spacer 125, the second spacer 155 and third spacer 175. The air gap 165 may be disposed on the substrate 100 or on a portion of the first spacer 125 adjacent to the substrate 100. For example, the air gap 165 may be defined by the sidewall of the first spacer 125, a sidewall of the second spacer 155 and a bottom surface of the third spacer 175. The first spacer 125 and the second spacer 155 may have top surfaces substantially higher than the top surface of the first conductive pattern 110 so that the air gap 165 between the first and second spacers 125 and 155 may have a height substantially larger than that of the first conductive pattern 110.

The air gap 165 may include an air, which has a relatively low dielectric constant. Thus, the parasitic capacitance between the first conductive patterns 110 may decrease. For example, the air gap 165 may surround the sidewall of the first conductive pattern 110, thereby reducing or preventing a coupling phenomenon between the first conductive patterns 110.

In example embodiments, the air gap 165 may sufficiently surround the sidewall of the first conductive pattern 110, and may extend in the first direction. In other example embodiments, the air gap 165 may partially surround the first conductive pattern 110.

A second conductive pattern 160 may be disposed on the substrate 100 between the second spacers 155. For example, the second conductive pattern 160 may include, e.g., doped polysilicon, a metal, a metal nitride, a metal silicide, etc. The second conductive pattern 160 may directly contact the top surface of the substrate 100, and may serve as a contact.

According to example embodiments, the air gap 165 may be defined by the sidewall of the first spacer 125, the sidewall of the second spacer 155, and the bottom surface of the third spacer 175. The first spacer 125 and the second spacer 155 may have different height, and the third spacer 175 may have a height corresponding to the difference between heights of the first spacer 125 and the second spacer 155. Therefore, the third spacer 175 may have a sufficient height. Thus, the third spacer 175 above the air gap 165 may not be easily damaged or broken.

FIGS. 2 to 12 are cross-sectional views illustrating a method of manufacturing a wiring structure in accordance with some example embodiments.

Figure 2:
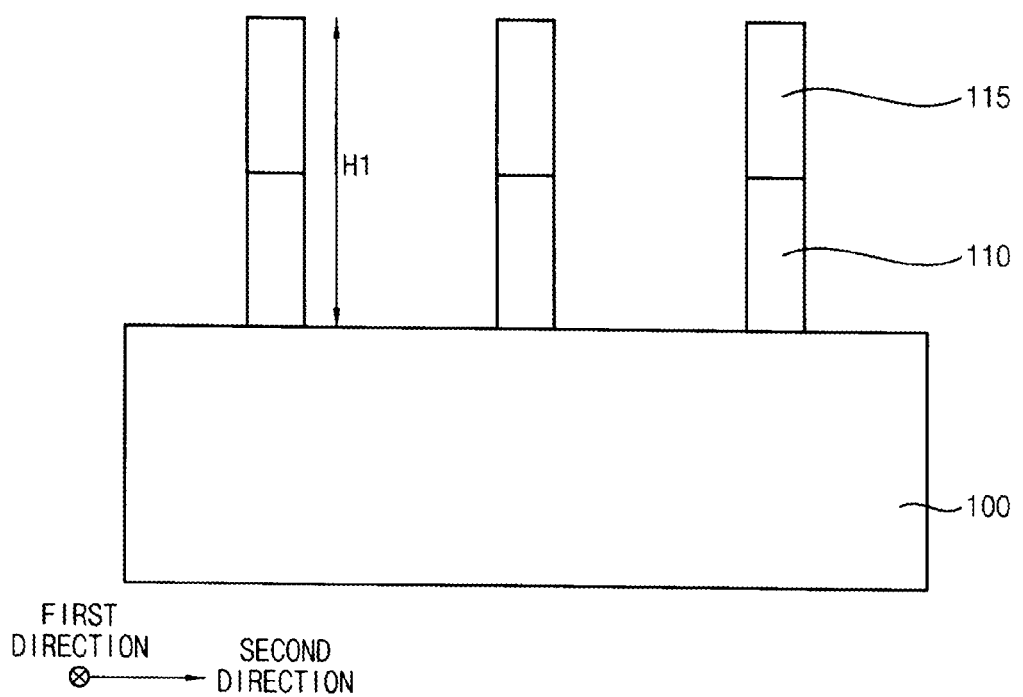

Referring to FIG. 2, a first conductive pattern 110 and a hardmask 115 may be formed on a substrate 100.

A first conductive layer and a hardmask layer may be formed on the substrate 100. The first conductive layer and the hardmask layer may be patterned by performing an etching process using a photoresist pattern, thereby forming the first conductive pattern 110 and the hardmask 115.

The substrate 100 may include a semiconductor substrate, e.g., a silicon substrate, a germanium substrate, a silicon-germanium substrate, a silicon-on-insulator (SOI) substrate, or a germanium-on-insulator (GOI) substrate. Further, the substrate 100 may further include an isolation layer and/or a well region doped by p-type impurities and/or n-type impurities.

The first conductive layer may be formed by using, e.g., a doped polysilicon, a metal, a metal nitride, a metal silicide, etc. For example, the first conductive pattern 110 may include the doped polysilicon or tungsten. For example, the first conductive pattern 110 may include the doped polysilicon and tungsten which may be sequentially stacked.

The hardmask layer may include an insulation material having an etch selectivity with respect to an oxide material. For example, the hardmask layer may include a nitride material, e.g., silicon nitride.

In example embodiments, a plurality of first conductive patterns 110 and a plurality of hardmasks 115 may be arranged in a second direction. Each of the first conductive patterns 110 and the hardmasks 115 may extend in a first direction substantially perpendicular to the second direction. In this case, a first height H1 may be defined as a sum of heights of the first conductive pattern 110 and the hardmask 115.

Figure 3:
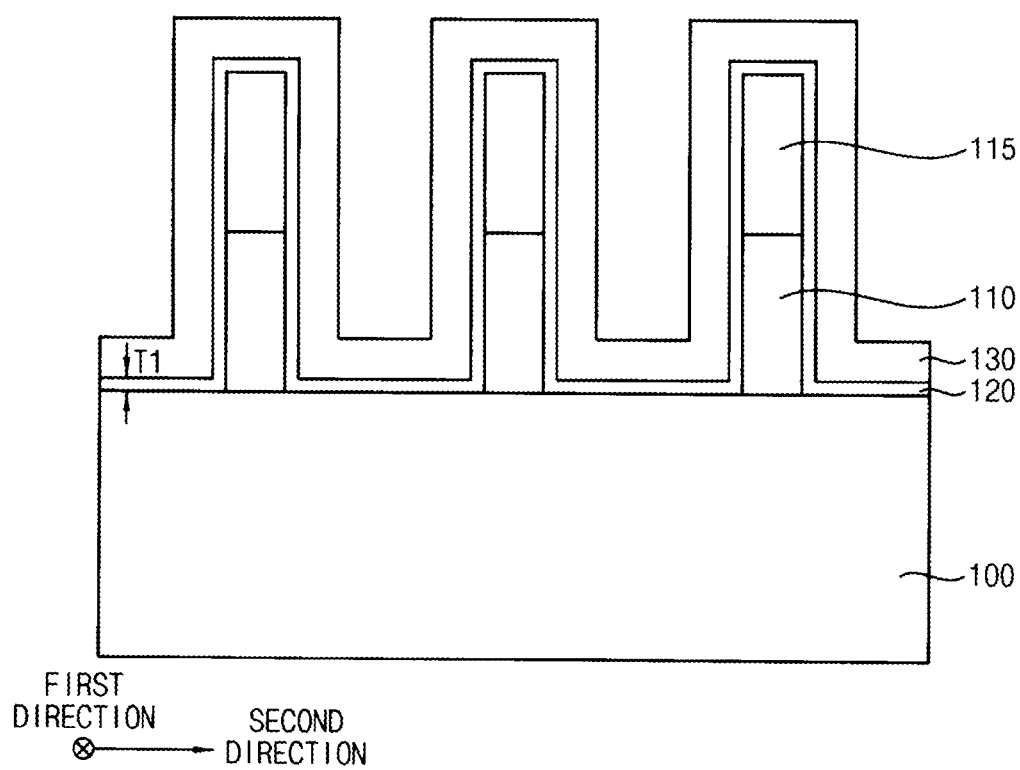

Referring to FIG. 3, a first spacer layer 120 and a first sacrificial layer 130 may be formed on the substrate 100 to cover the first conductive pattern 110 and the hardmask 115.

The first spacer layer 120 may include a material substantially the same as or similar to that of the hardmask 115, and may be formed by using a chemical vapor deposition (CVD) process or an atomic layer deposition (ALD) process. For example, the first spacer layer 120 may include silicon nitride. The first spacer layer 120 may be conformally formed on a top surface of the substrate 100, a sidewall of the first conductive pattern 110, a top surface and a sidewall of the hardmask 115. The first spacer layer 120 may have a first thickness T1

The first sacrificial layer 130 may include a material having an etch selectivity with respect to the first spacer layer 120, and may be formed by using a CVD process or an ALD process. For example, the first sacrificial layer 130 may include silicon oxide, e.g., Boro-Phospho-Silicate Glass (BPSG), Tonen Silazene (TOSZ), Undoped Silicate Glass (USG), Spin On Glass (SOG), Flowable Oxide (FOX), Tetra-Ethyl-Ortho-Silicate (TEOS), High Density Plasma Chemical Vapor Deposition (HDP-CVD) oxide. In example embodiments, the first sacrificial layer 130 may have a thickness substantially larger than the first thickness T1 of the first spacer layer 120.

Figure 4:
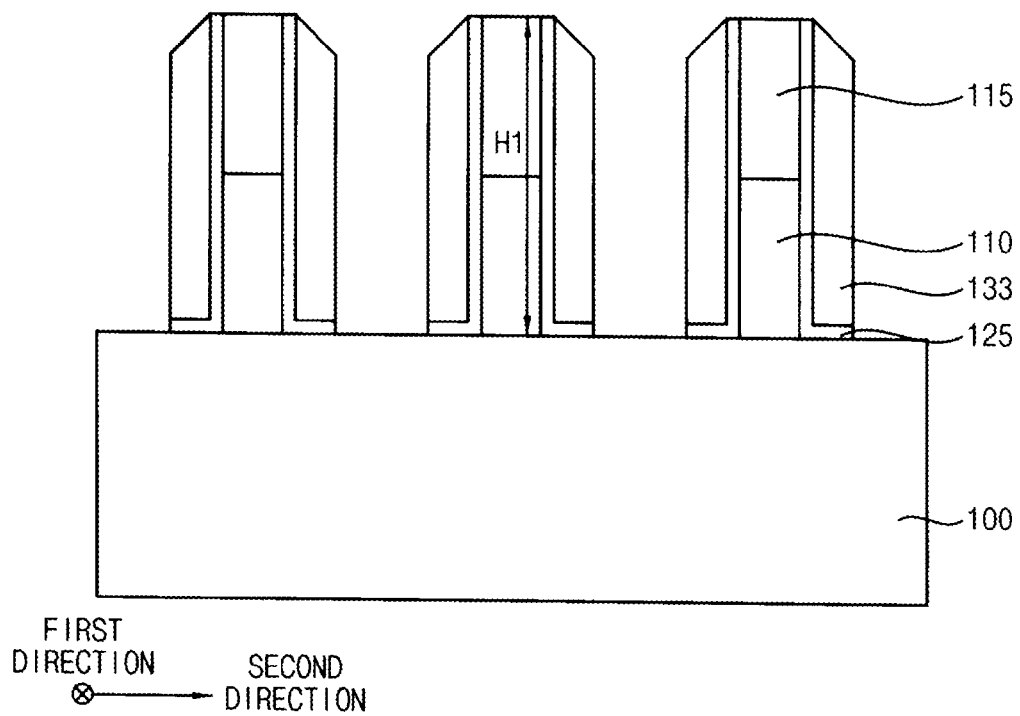

Referring to FIG. 4, the first spacer layer 120 and the first sacrificial layer 130 may be partially removed to form a preliminary first sacrificial layer pattern 133 and a first spacer 125.

By performing an etching process, some portions of the first spacer layer 120 and the first sacrificial layer 130 adjacent to the substrate 100 may be removed. Some portions of the first spacer layer 120 and the first sacrificial layer 130 adjacent to the top surface of the hardmask 115 may be removed. The etching process may be an anisotropic etching process. Thus, other portions of the first spacer layer 120 and the first sacrificial layer 130 on the sidewalls of the first conductive pattern 110 and the hardmask 115 may remain (e.g., may not be completely removed), thereby defining the first spacer 125 and the preliminary first sacrificial layer pattern 133, respectively.

In this case, the first spacer 125 may have a top surface which may be substantially higher than a top surface of the first conductive pattern 110, and may be substantially equal to or lower than the top surface of the hardmask 115. In example embodiments, the first spacer 125 may have a height substantially equal to a sum of heights of the first conductive pattern 110 and the hardmask 115. For example, the first spacer 125 may have a first height H1 from the top surface of the substrate 100. Further, the preliminary first sacrificial layer pattern 133 may have a height corresponding to the first height H1 of the first spacer 125.

In example embodiments, the preliminary first sacrificial layer pattern 133 and the first spacer 125 may extend in the first direction.

The process for removing the portion of the first spacer layer 120 and the process for removing the portion of the first sacrificial layer 130 may be performed simultaneously, or may be performed separately.

Figure 5:
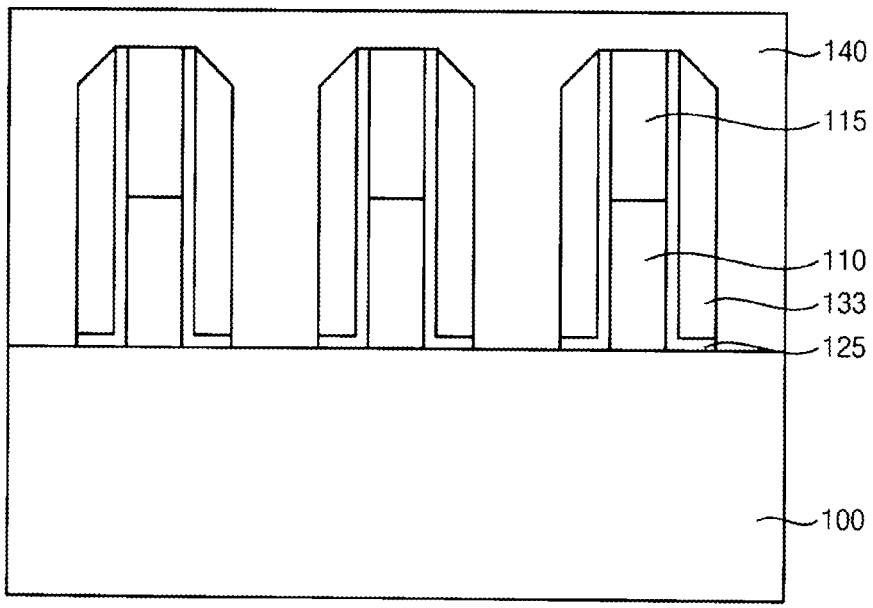

Referring to FIG. 5, a second sacrificial layer 140 may be formed on the substrate 100 to cover the hardmask 115, the preliminary first sacrificial layer pattern 133 and the first spacer 125.

The second sacrificial layer 140 may include a material having an etch selectivity with respect to the preliminary first sacrificial layer pattern 133 and the first spacer 125. In example embodiments, the second sacrificial layer 140 may include a polymer material. For example, the second sacrificial layer 140 may include, e.g., carbon based spin-on hardmask (C-SOH) or amorphous carbon layer (ACL), but are not limited thereto.

Figure 6:
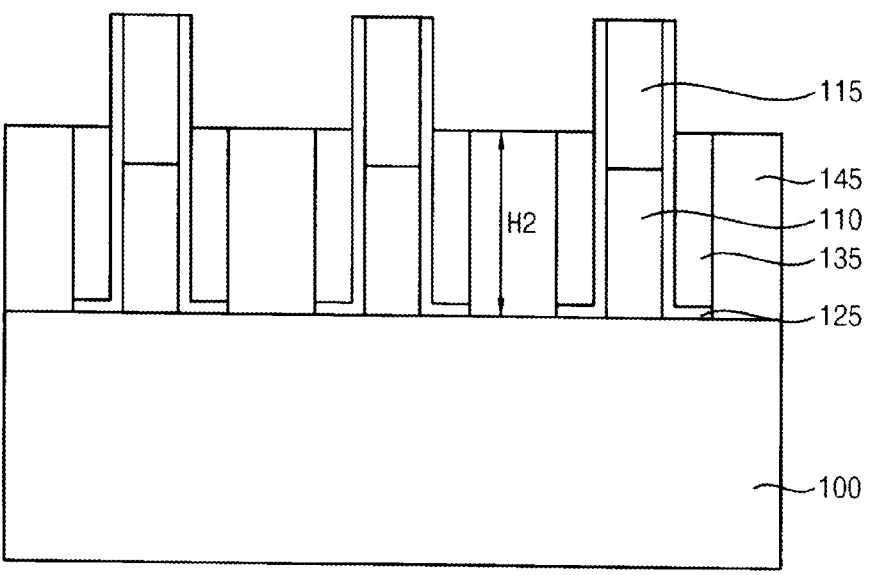

Referring to FIG. 6, upper portions of the second sacrificial layer 140 and the preliminary first sacrificial layer pattern 133 may be removed to form the second sacrificial layer pattern 145 and the first sacrificial layer pattern 135, respectively.

In example embodiments, the upper portion of the second sacrificial layer 140 may be removed by performing an etch back process and/or a chemical mechanical polishing (CMP) process until the hardmask 115 projects above the second sacrificial layer 140. Therefore, the second sacrificial layer pattern 145 may have a second height H2 substantially smaller than the first height H1 of the first spacer 125.

Then, the preliminary first sacrificial layer pattern 133 may be partially removed, for instance, by an etching process using an etching gas having a relatively high etch rate with respect to the preliminary first sacrificial layer pattern 133. For example, the upper portion of the preliminary first sacrificial layer pattern 133, which may be exposed by the second sacrificial layer pattern 145, may be removed. Therefore, the first sacrificial layer pattern 135 may have a height substantially the same as the second height H2 of the second sacrificial layer pattern 145.

In other example embodiments, upper portions of the second sacrificial layer 140 and the preliminary first sacrificial layer pattern 133 may be removed simultaneously by a single etch back process and/or a single CMP process. Thus, the second sacrificial layer pattern 145 and the first sacrificial layer pattern 135 may be formed to have the second height H2, simultaneously.

Figure 7:
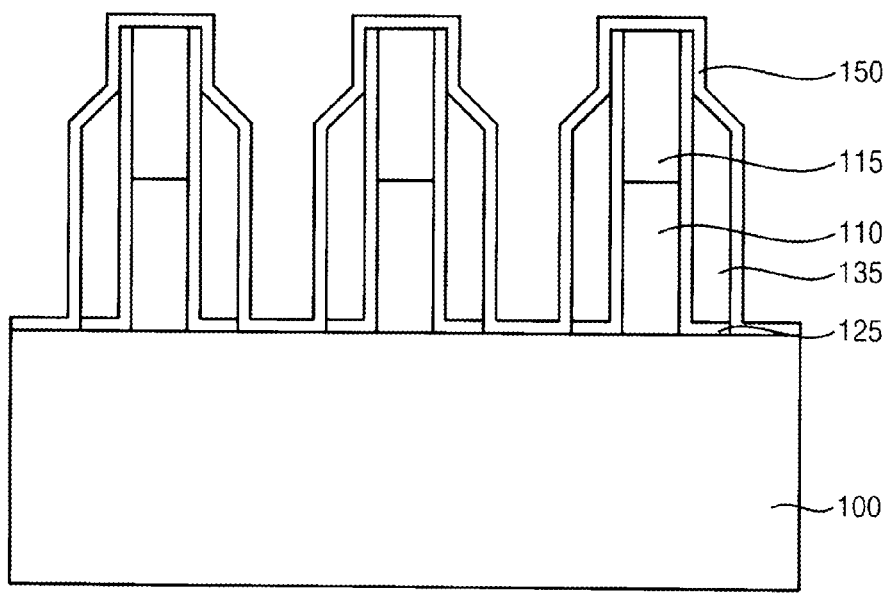

Referring to FIG. 7, the second sacrificial layer pattern 145 may be removed, and a second spacer layer 150 may be formed on the substrate 100 to cover the hardmask 115, the first spacer 125, and the first sacrificial layer pattern 135.

The second sacrificial layer pattern 145 may be substantially completely removed by using a reactive ion etching (RIE) process or a plasma etching process. During this removal process, the first spacer 125 and the hardmask 115 may prevent or reduce damage to the first conductive pattern 110 and/or an oxidation of the first conductive pattern 110. Further, upper portion of the first sacrificial layer 135 may be partially removed, so that the first sacrificial layer 135 may have an inclined top surface.

Then, the second spacer layer 150 may be conformally formed on the top surface of the substrate 100, the top surface and the sidewall of the first sacrificial layer pattern 135, the top surface and the sidewall of the first spacer 125, and the top surface of the hardmask 115. The second spacer layer 150 may include a material substantially the same as that of the first spacer layer 120. For example, the second spacer layer 150 may include silicon nitride.

Figure 8:
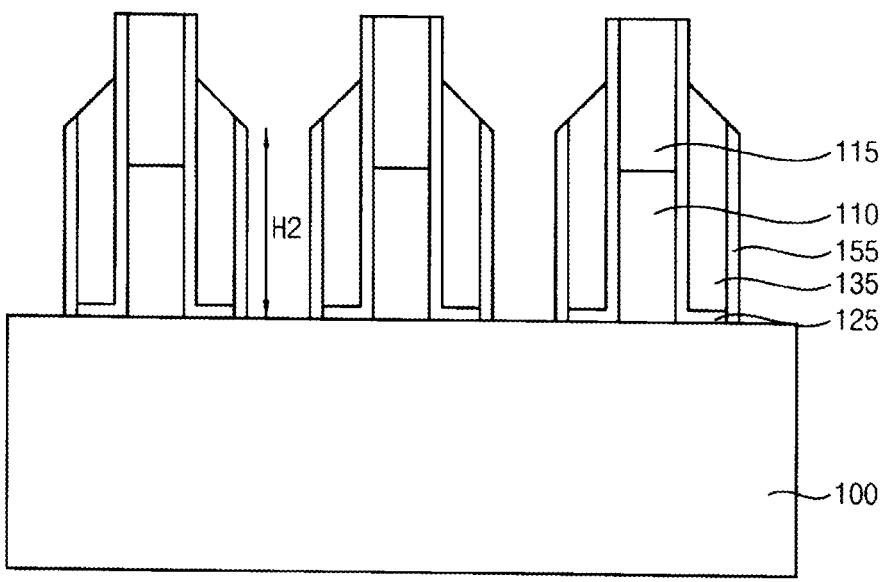

Referring to FIG. 8, the second spacer layer 150 may be partially removed to form a second spacer 155.

In example embodiments, some portions of the second spacer layer 150 on the substrate 100 and the top surface of the hardmask 115 may be removed by using an etching process. The etching process may be an anisotropic etching process. Thus, other portions of the second spacer layer 150 on the sidewalls of the first spacer 125 and the first sacrificial layer pattern 135 may remain (e.g., may not be completely removed), thereby defining the second spacer 155. Therefore, the second spacer 155 may have a height corresponding or comparable to the height of the first sacrificial layer pattern 135. The height of the second spacer 155 may be smaller than the first height H1 of the first spacer 125. For example, the second spacer 155 may have the second height H2.

Figure 9:
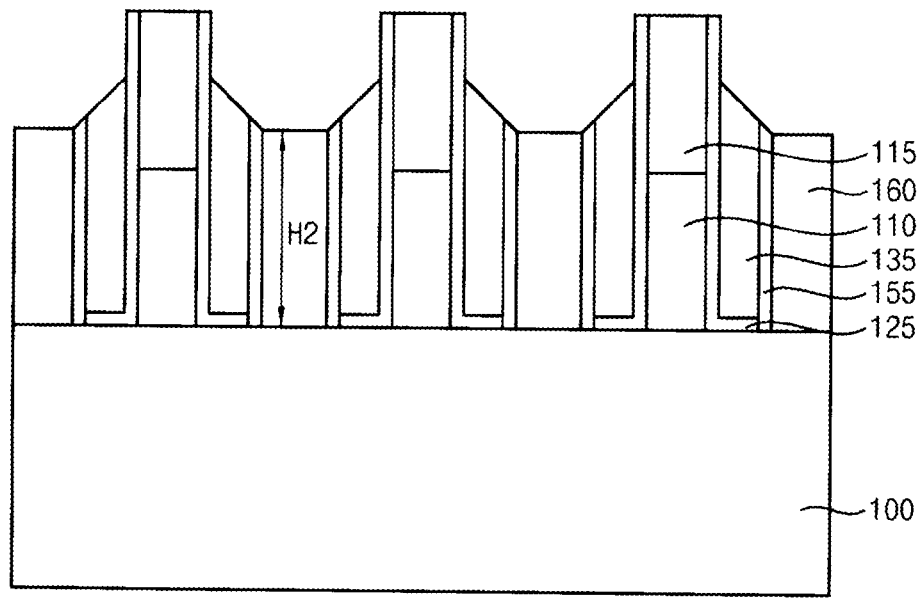

Referring to FIG. 9, a second conductive pattern 160 may be formed to fill a space between the second spacers 155.

A second conductive layer may be formed on the substrate 100 to cover the hardmask 115, the first spacer 125, the first sacrificial layer pattern 135 and the second spacer 155. Then, an upper portion of the second conductive layer may be removed by performing an etch back process and/or a CMP process until the top surface of the first sacrificial layer pattern 135 is exposed, thereby forming the second conductive pattern 160.

In example embodiments, the second conductive layer may include, e.g., doped polysilicon, a metal, a metal nitride, a metal silicide, etc.

Figure 10:
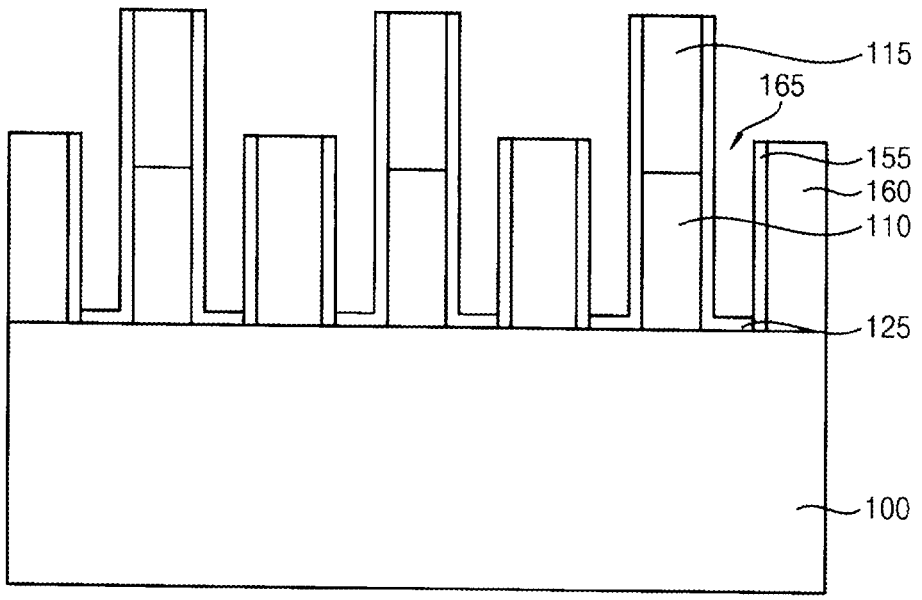

Referring to FIG. 10, the first sacrificial layer pattern 135 may be removed by using an etching process such that an air gap 165 may be formed between the first spacer 125 and the second spacer 155.

The etching process may be performed using an etching gas having a relatively large etch rate with respect to the first sacrificial layer pattern 135. Due to the etch selectivity, the first spacer 125 and the second spacer 155 may not be removed. During the etching process, the first spacer 125 and the hardmask 115 may prevent or reduce damage to the first conductive pattern 110 and/or an oxidation of the first conductive pattern 110.

By removing the first sacrificial layer pattern 135, the air gap 165 (that is a void space) may be formed between the sidewalls of the first spacer 125 and the second spacer 155. The air gap 165 may include an air, which has a relatively low dielectric constant. Thus, the parasitic capacitance between the first and second conductive patterns 110 and 160 may decrease.

Figure 11:
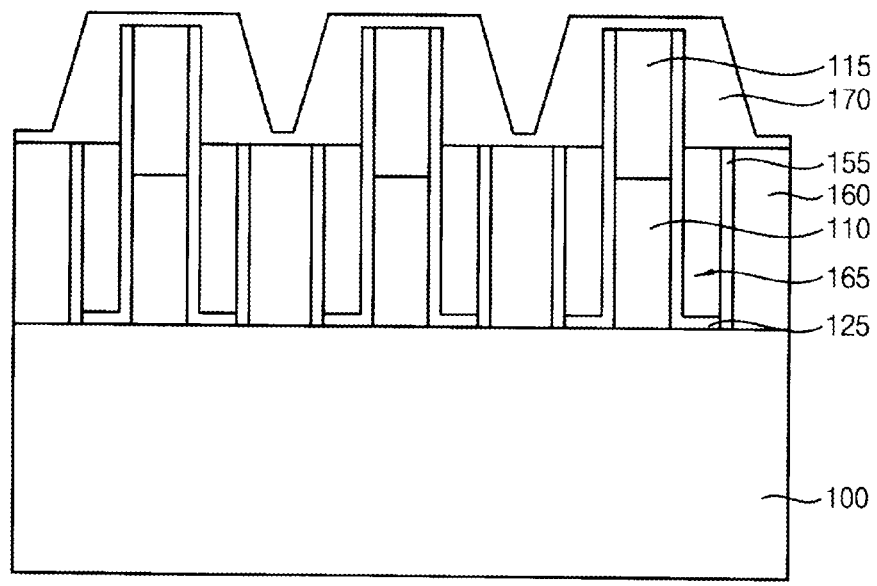

Referring to FIG. 11, a third spacer layer 170 may be formed on the second conductive pattern 160 and the second spacer 155 to cover or enclose the air gap 165, the hardmask 115 and the first spacer 125.

The third spacer layer 170 may be formed on the top surface of the hardmask 115, the top surface and the sidewall of the first spacer 125, the top surface of the second spacer 155, and the top surface of the second conductive pattern 160. Therefore, the air gap 165 may be defined by the sidewall of the first spacer 125, the sidewall of the second spacer 155 and a bottom surface of the third spacer layer 170.

The third spacer layer 170 may be formed by using a process having a relatively low gap fill characteristic and/or a relatively low step coverage. For example, the third spacer layer 170 may be formed by using a plasma-enhanced CVD (PECVD) process or a sputtering process. Therefore, the third spacer layer 170 may not fill the air gap 165.

In example embodiments, the third spacer layer 170 may include a material substantially the same as or similar to that of the first spacer layer 120 or the second spacer layer 150. For example, the third spacer layer 170 may include silicon nitride.

Figure 12:
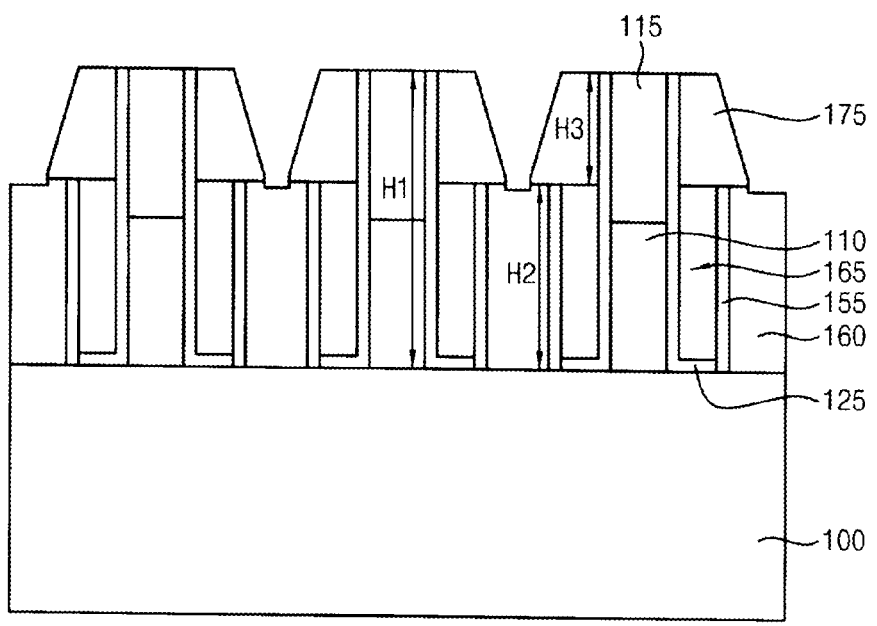

Referring to FIG. 12, the third spacer layer 170 may be partially removed to form a third spacer 175.

Some portions of the third spacer layer 170, which may be disposed on the top surfaces of the hardmask 115 and the second conductive pattern 160, may be removed by using an anisotropic etching process. Other portions of the third pacer layer 170 may define the third spacer 175. Therefore, the third spacer 175 may directly contact the sidewall of the first spacer 125 and the top surface of the second spacer 155, and may cover the air gap 165.

In example embodiments, the bottom surface of the third spacer 175 may directly contact the top surface of the second spacer 155, and the top surface of the third spacer 175 may be substantially equal to the top surfaces of the first spacer 125 and/or the hardmask 115. Therefore, a third height H3 of the third spacer 175 may correspond to a difference between the first height H1 of the first spacer 125 and the second height H2 of the second spacer 155. For example, the third height H3 of the third spacer 175 may be at least two times larger than a thickness of the first spacer 125 or a thickness of the second spacer 155. Therefore, the third spacer 175 disposed on the air gap 165 may not be easily damaged or broken.

According to example embodiments, the air gap 165 may be defined by the sidewall of the first spacer 125, the sidewall of the second spacer 155 and the bottom surface of the third spacer 175. The first spacer 125 and the second spacer 155 may have different height, and the third spacer 175 may have a height corresponding to the difference between heights of the first spacer 125 and the second spacer 155. As such, the third spacer 175 may have a sufficient height. Thus, the third spacer 175 above the air gap 165 may not be easily damaged or broken.

FIGS. 13 to 17 are cross-sectional views illustrating a method of manufacturing a wiring structure in accordance with some example embodiments.

The method of manufacturing the wiring may be substantially the same as or similar to those illustrated with reference to FIGS. 2 to 12. Thus, like reference numerals refer to like elements, and repetitive explanations thereon may be omitted herein.

Processes substantially the same as or similar to those illustrated with reference to FIGS. 2 to 4 may be performed.

For example, a first conductive pattern 110 and a hardmask 115 may be formed on a substrate 100. Further, a first spacer 125 and a first sacrificial layer pattern 136 may be formed on sidewalls of the first conductive pattern 110 and the hardmask 115.

Figure 13:
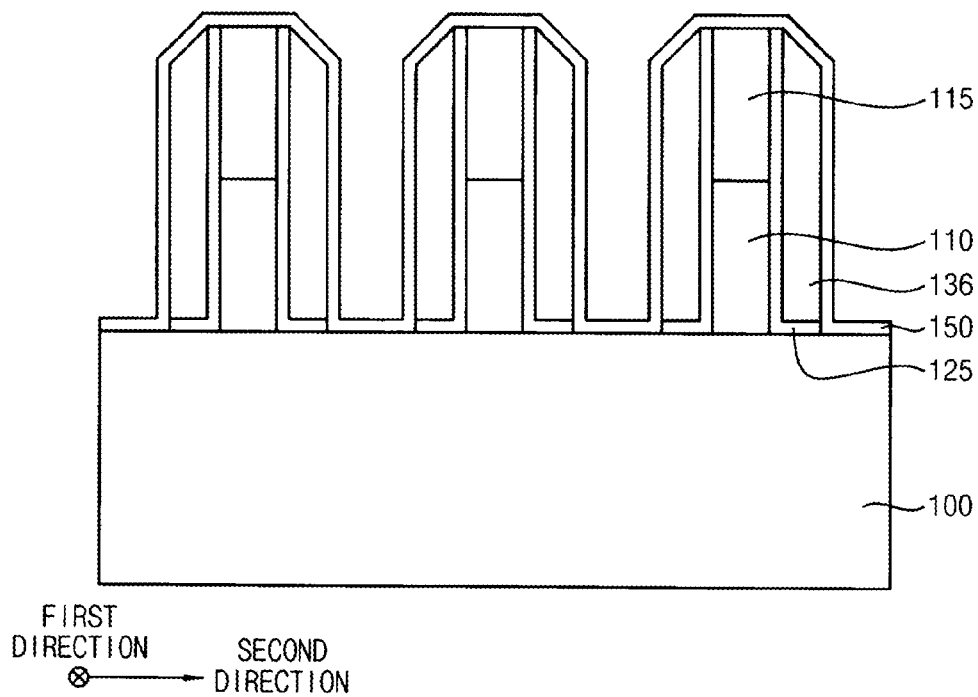

Referring to FIG. 13, a second spacer layer 150 may be formed on the substrate 100 to cover the hardmask 115, the first spacer 125 and the first sacrificial layer pattern 136. The second spacer layer 150 may be conformally formed on a top surface and a sidewall of the first sacrificial layer pattern 136.

Figure 14:
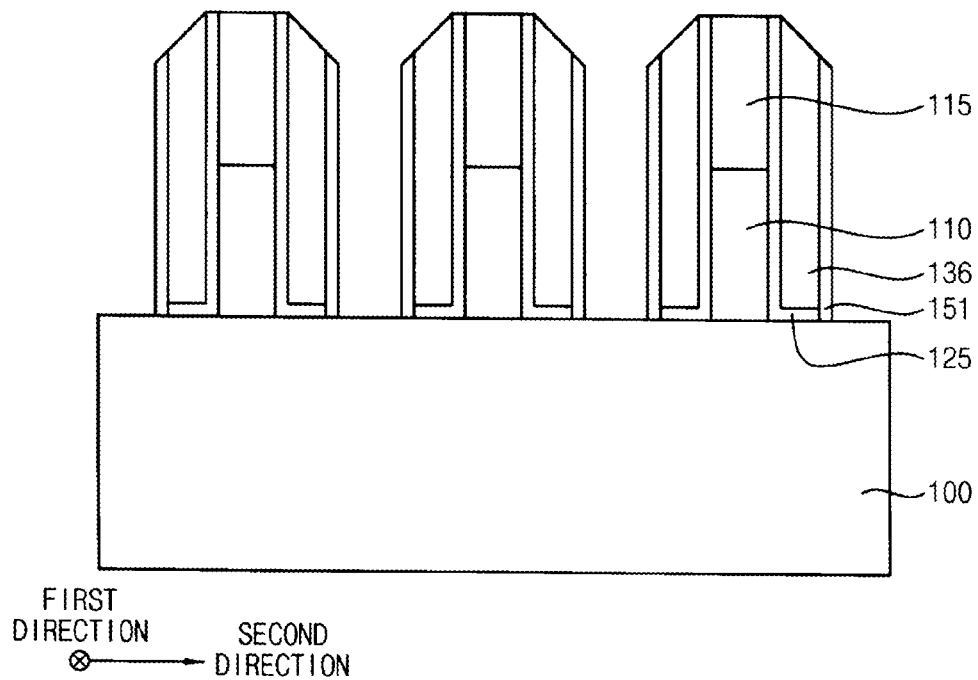

Referring to FIG. 14, the second spacer layer 150 may be partially removed.

For example, some portions of the second spacer layer 150, which may be disposed on the top surface of the substrate 100, the top surface of the hardmask 115, the top surface of the first spacer 125 and the top surface of the first sacrificial layer pattern 136, may be removed. Remaining portions of the second spacer layer 150 disposed on the sidewall of the first sacrificial layer pattern 136 may be referred as a preliminary second spacer 151.

Figure 15:
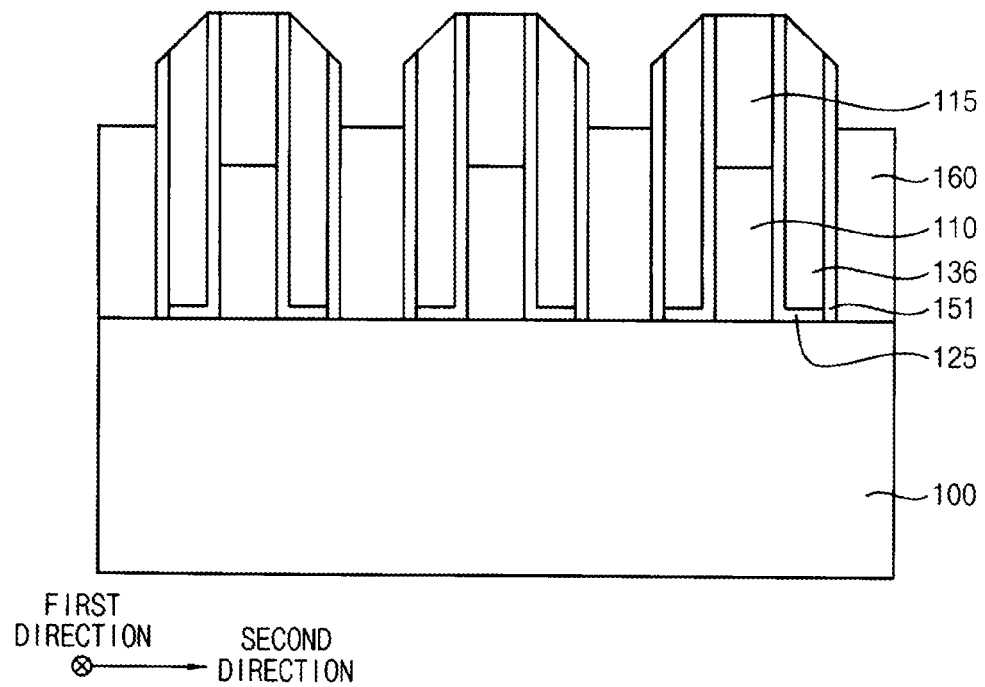

Referring to FIG. 15, a second conductive pattern 160 may be formed on the substrate 100 between the preliminary second spacer layer patterns 151.

A second conductive layer may be formed on the substrate 100 to cover the hardmask 115, the first spacer 125, the first sacrificial layer pattern 136, and the preliminary second spacer 151. The upper portion of the second conductive layer may be planarized by using an etch back process and/or a CMP process to form the second conductive pattern 160. The second conductive pattern 160 may have a height substantially smaller than that of the preliminary second spacer 151. The second conductive pattern 160 may partially surround a sidewall of the preliminary second spacer 151.

Figure 16:
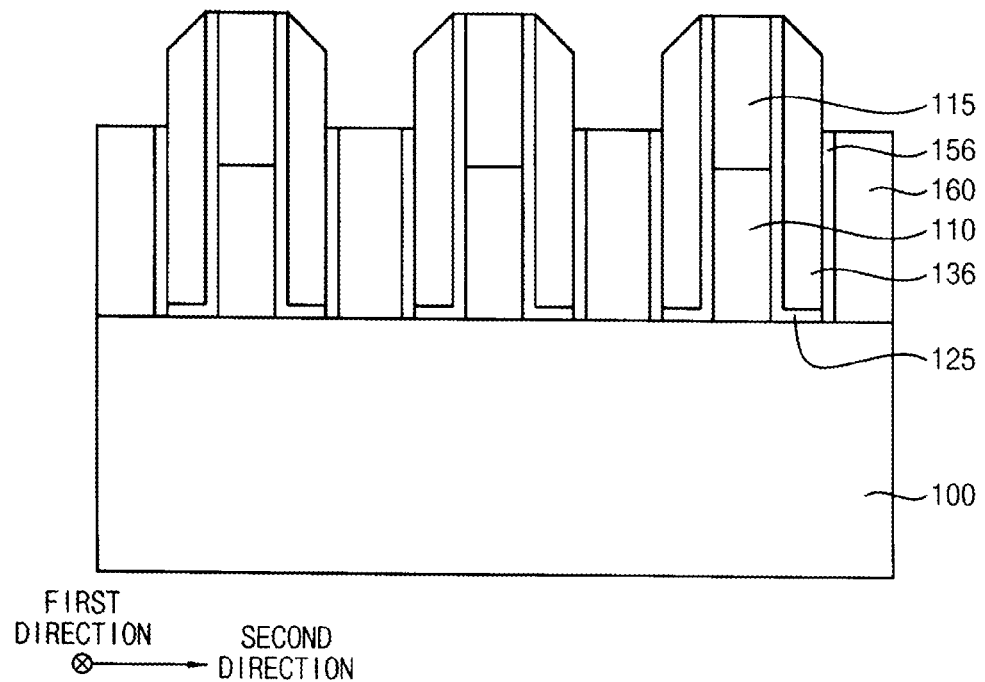

Referring to FIG. 16, the preliminary second spacer 151 may be partially removed to form the second spacer 156.

In example embodiments, the preliminary second spacer 151 may be selectively removed by performing an etching process using an etching gas having a relatively high etch rate with respect to the preliminary second spacer 151. Thus, some portions of the preliminary second spacer 151 exposed by the second conductive pattern 160 may be removed, and other portions of the preliminary second spacer 151 adjoining the second conductive pattern 160 may remain (e.g., may not be completely removed). Accordingly, the second spacer 156 may be formed.

Figure 17:
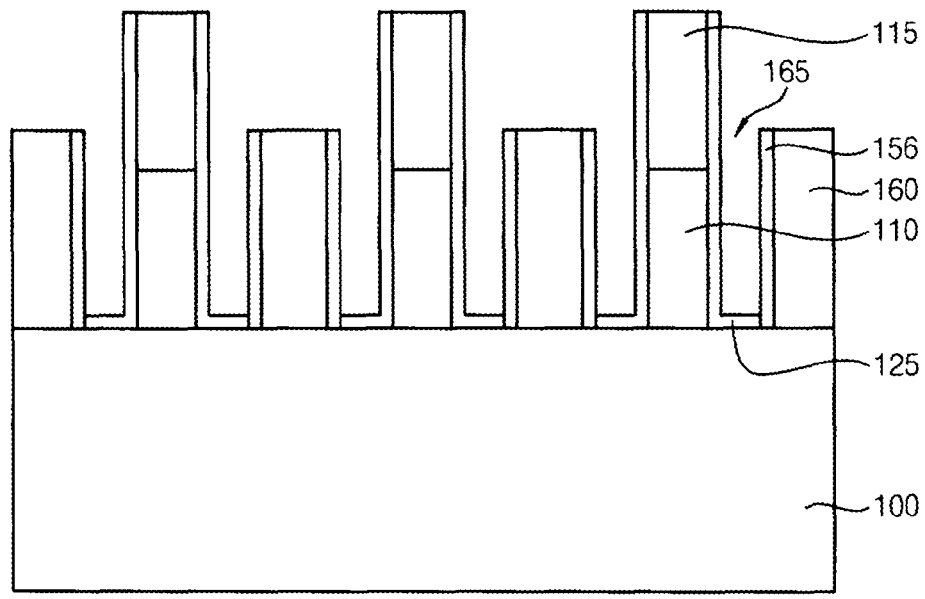

Referring to FIG. 17, the first sacrificial layer pattern 136 may be removed to form an air gap 165.

Process for removing the first sacrificial layer pattern 136 may be substantially the same as or substantially similar to the process described with reference to FIG. 10.

Then, processes substantially the same as similar to those illustrated in FIGS. 11 and 12 may be performed to form a third spacer 175 covering or enclosing the air gap 165.

According to example embodiments, the air gap 165 may be defined by the sidewall of the first spacer 125, the sidewall of the second spacer 156 and a bottom surface of the third spacer 175. The first spacer 125 and the second spacer 156 may have different heights, and the third spacer 175 may have a height corresponding to the difference between the heights of the first spacer 125 and the second spacer 156. Therefore, the third spacer 175 may have a sufficient height. Thus, the third spacer 175 above the air gap 165 may not be easily damaged or broken.

Figure 18:
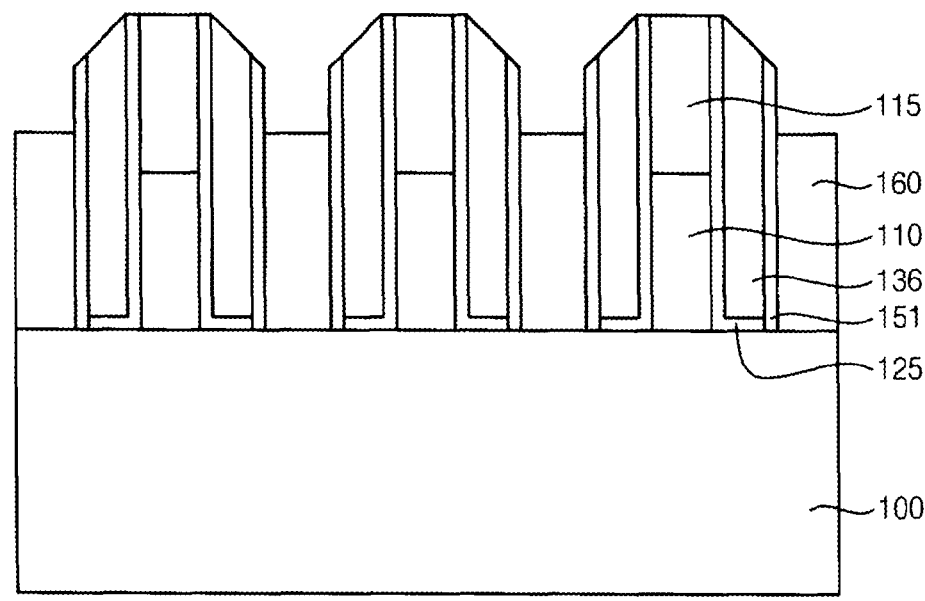
Figure 19:
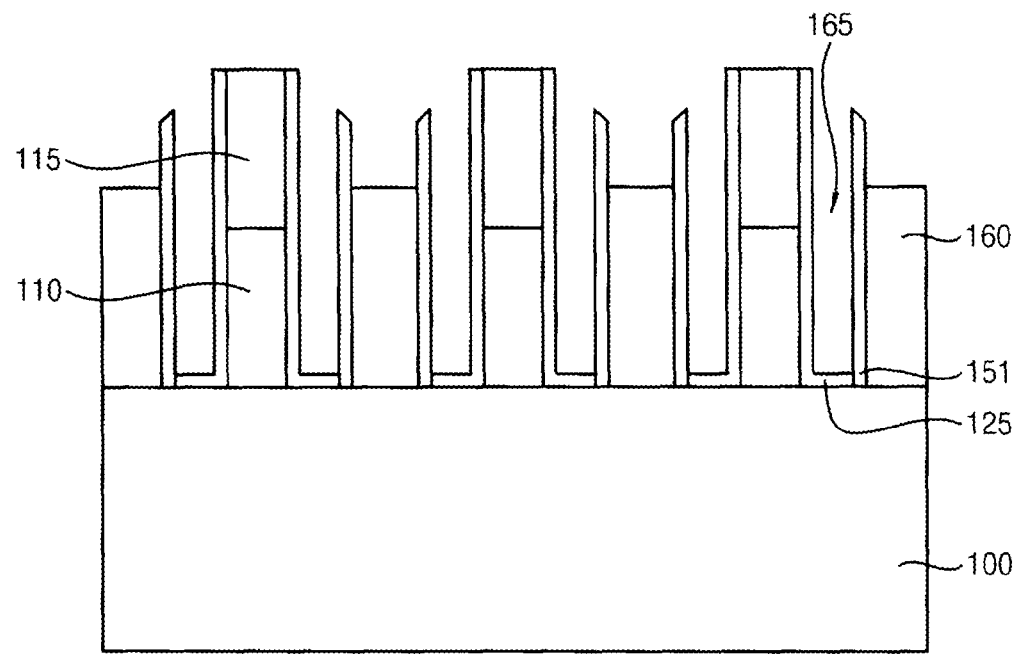
Figure 20:
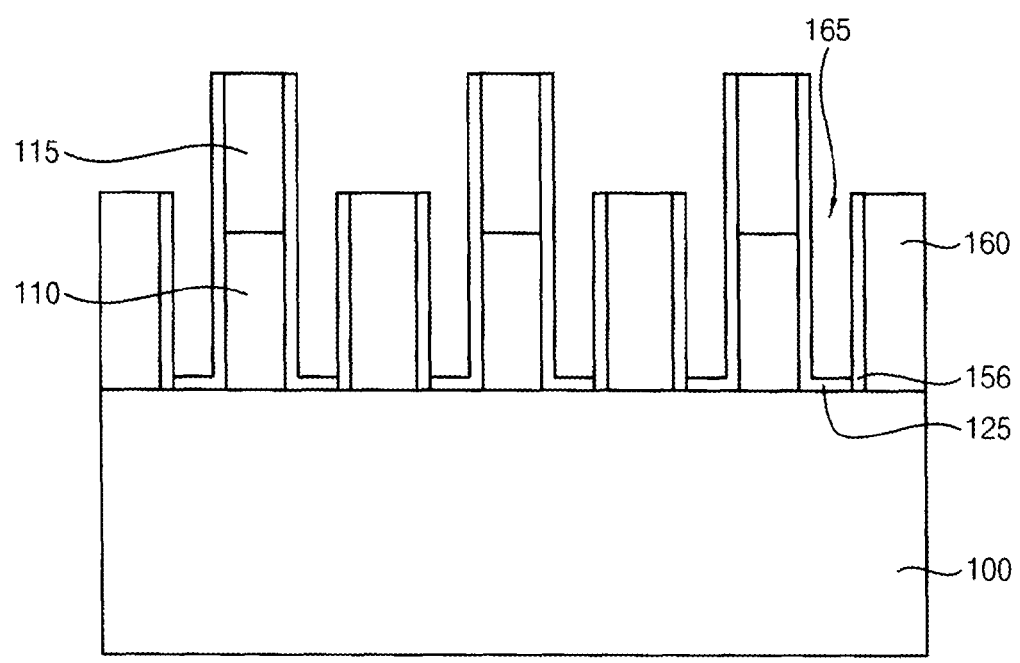

FIGS. 18 to 20 are cross-sectional views illustrating a method of manufacturing a wiring structure in accordance with some example embodiments.

The method of manufacturing the wiring may be substantially the same as or similar to those illustrated with reference to FIGS. 13 to 17. Thus, like reference numerals refer to like elements, and repetitive explanations thereon may be omitted herein.

Processes substantially the same as or similar to those illustrated with reference to FIGS. 13 to 15 may be performed. For example, a first conductive pattern 110 and a hardmask 115 may be formed on a substrate 100. Further, a first spacer 125, a first sacrificial layer pattern 136, and a preliminary second spacer 151 may be formed on sidewalls of the first conductive pattern 110 and the hardmask 115.

Referring to FIG. 18, a second conductive pattern 160 may be formed on the substrate 100 between the preliminary second spacers 151.

Referring to FIG. 19, the first sacrificial layer pattern 136 may be removed to form an air gap 165.

Process for removing the first sacrificial layer pattern 136 may be substantially the same as or substantially similar to the process described with reference to FIG. 10.

Referring to FIG. 20, the preliminary second spacer 151 may be partially removed to form a second spacer 156.

In example embodiments, the preliminary second spacer 151 may be selectively removed by performing an etching process using an etching gas having a relatively high etch rate with respect to the preliminary second spacer 151. Therefore, while removing some portions of the preliminary second spacer 151, other portions of the preliminary second spacer 151 may remain (e.g., may not be completely removed) to form the second spacer 156.

In other example embodiments, the first sacrificial layer pattern 136 and the portion of the preliminary second spacer 151 may be removed simultaneously. For example, the first sacrificial layer pattern 136 and the portion of the preliminary second spacer 151 may be removed by using a single etching process using an etching gas having a relatively high etch rate with respect to the first sacrificial layer pattern 136 and the preliminary second spacer 151. For example, a period of the etching process may be adjusted such that portions of the preliminary second spacer 151 adjoining the second conductive pattern 160 may remain (e.g., may not be completely removed).

Then, processes substantially the same as similar to those illustrated in FIGS. 11 and 12 may be performed to form a third spacer 175 covering or enclosing the air gap 165.

According to example embodiments, the air gap 165 may be defined by the sidewall of the first spacer 125, the sidewall of the second spacer 155 and a bottom surface of the third spacer 175. The third spacer 175 may have a sufficient height. Thus, the third spacer 175 above the air gap 165 may not be easily damaged or broken.

FIGS. 21 to 34 are plan views and cross-sectional views illustrating a method of manufacturing a semiconductor device in accordance with some example embodiments.

Particularly, FIGS. 21, 23, 26 and 28 are plan views illustrating a method of manufacturing the semiconductor device in accordance with example embodiments. FIGS. 22, 24, 27, and 29-34 are cross-sectional views cut along the lines I-I' of FIGS. 21, 23, 26 and 28, respectively, and FIG. 25 are cross-sectional views cut along the lines II-II' of FIG. 23.

Figure 21:
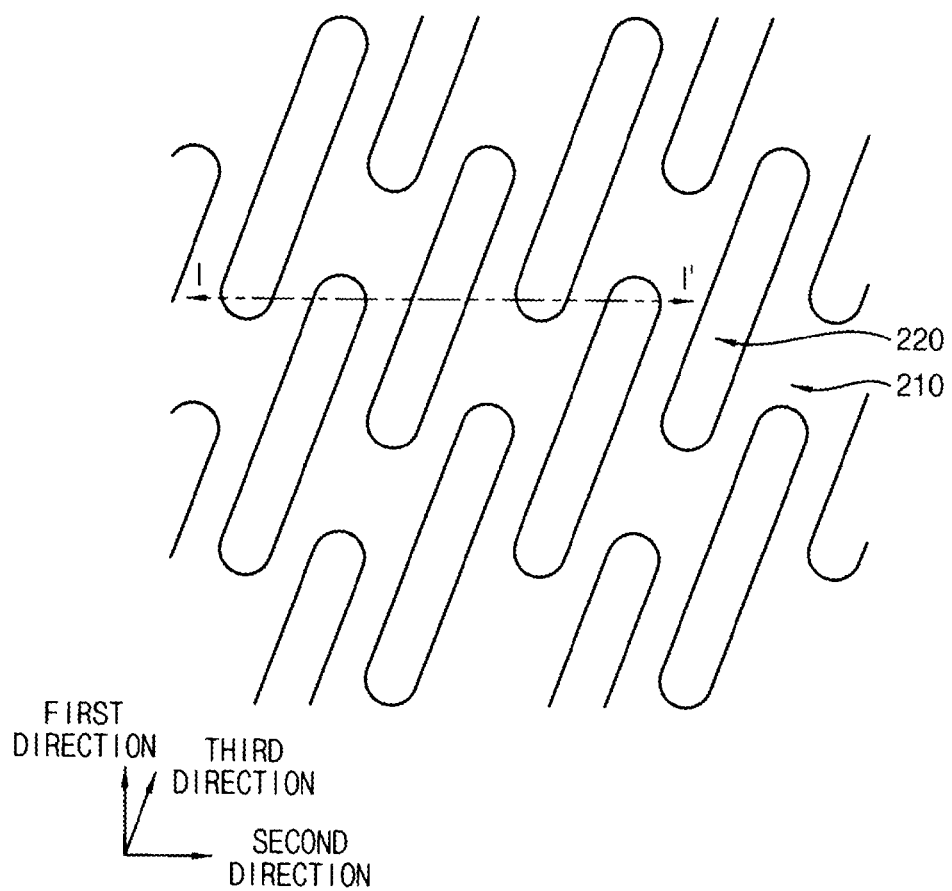
Figure 22:
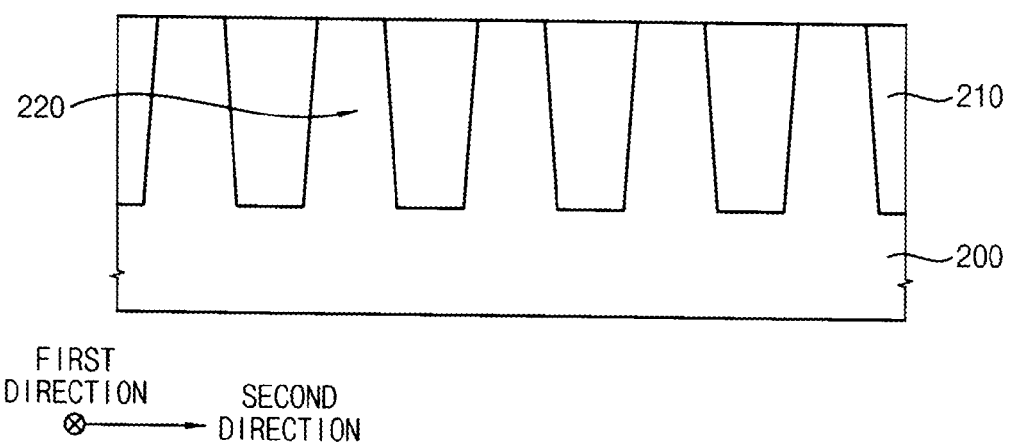

Referring FIG. 21 and FIG. 22, an isolation layer 210 may be formed on a substrate 200, thereby defining an active pattern 220.

The substrate 200 may include a semiconductor substrate, e.g., a silicon substrate, a germanium substrate, a silicon-germanium substrate, a silicon-on-insulator (SOI) substrate, or a germanium-on-insulator (GOI) substrate.

The isolation layer 210 may be formed by using a shallow trench isolation (STI) process, and may include, e.g., silicon oxide. Therefore, the substrate 200 may be divided into a field region where the isolation layer 210 is disposed and the active region 220 where the isolation layer 210 is not disposed. In example embodiments, a plurality of active patterns 220 may be arranged in a first direction and a second direction substantially perpendicular to the first direction. Each of the active patterns 220 may extend in a third direction oriented obliquely with respect to the first direction.

In example embodiments, impurity regions (not illustrated) may be formed in the active pattern 220 by implanting n-type impurities or p-type impurities.

Figure 23:
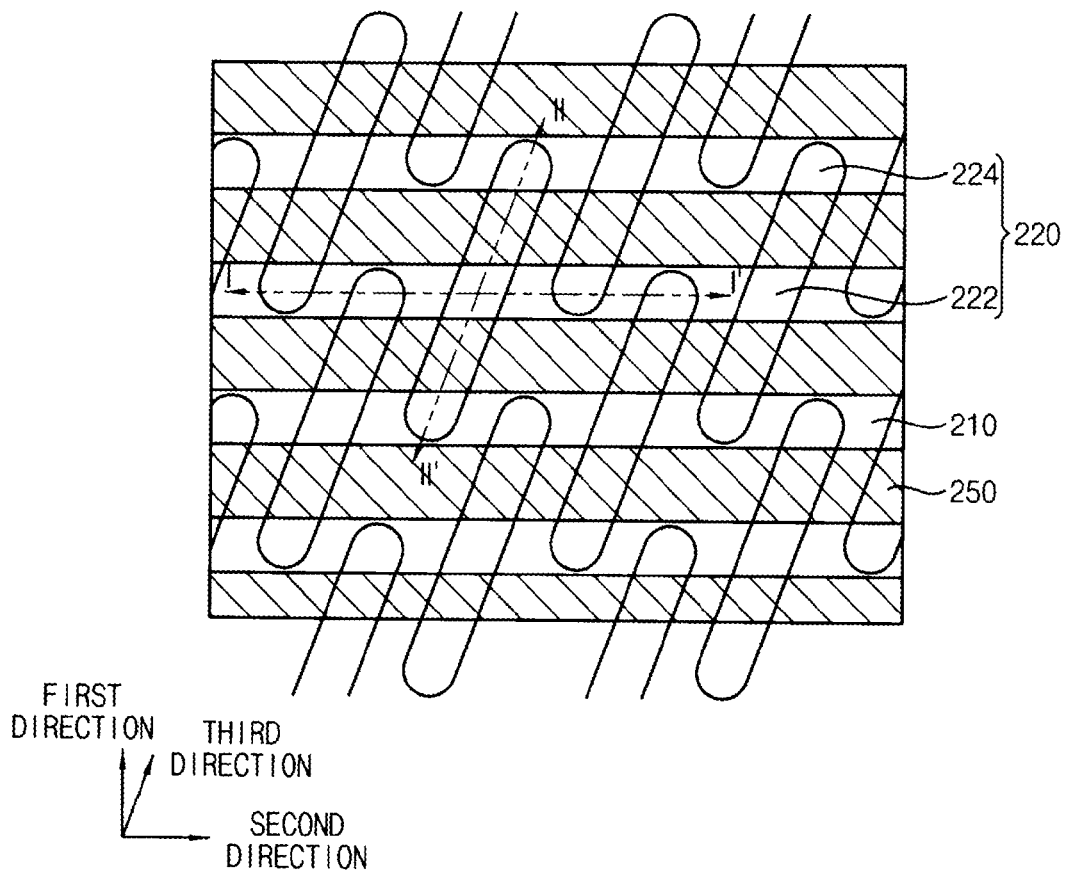
Figure 24:
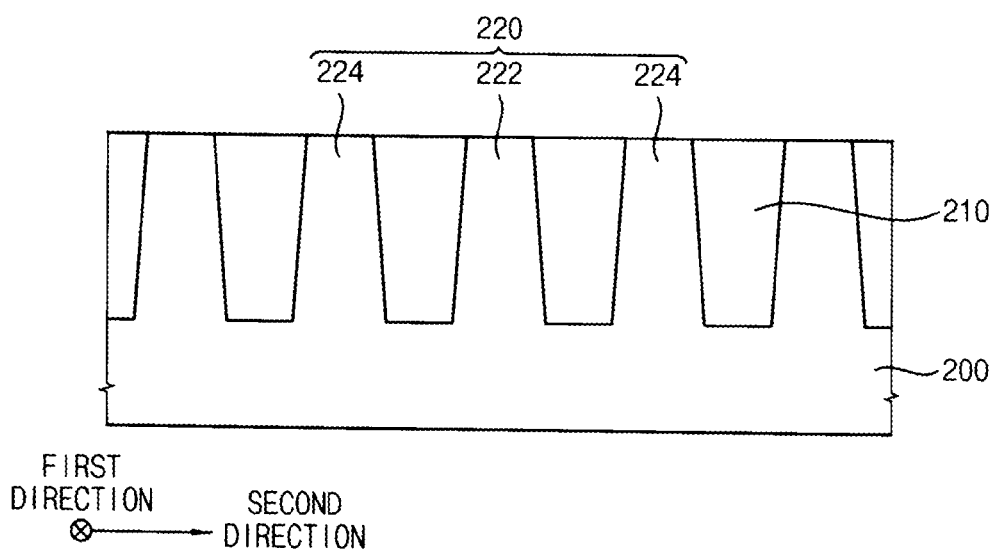
Figure 25:
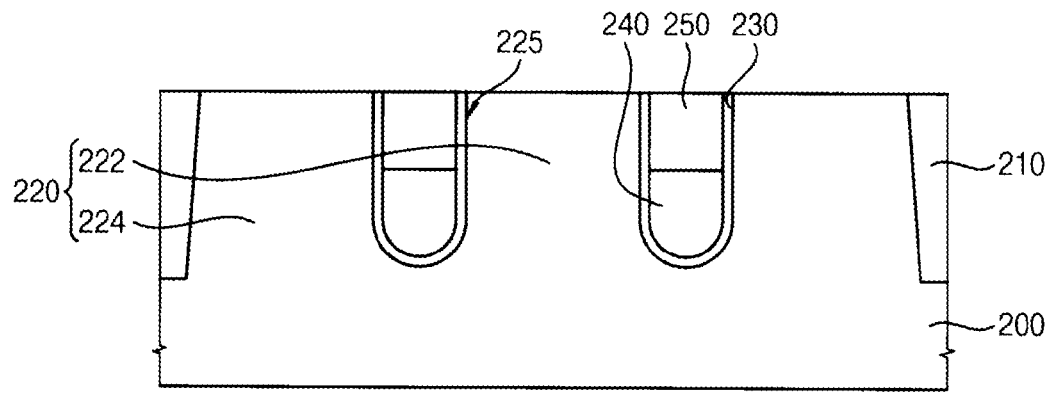

Referring to FIGS. 23-25, a trench 225 may be formed to overlap the active pattern 220, and a gate insulation layer pattern 230, a gate electrode 240, and a gate mask 250 may fill the trench 225.

A mask may be formed on the substrate 200 and the isolation layer 210, and the substrate 200 and the isolation layer 210 may be partially removed by performing an etching process using the mask, thereby forming the trench 225.

In example embodiments, a plurality of trenches 225 may be arranged in the first direction. Each of the trenches 225 may extend in the second direction. At least one trench 225 may overlap a single active pattern 220. As illustrated in FIG. 23, a couple of trenches 225 may overlap the single active pattern 220. Therefore, the active pattern 220 may be divided into a first region 222 between the couple of trenches 225 and a second region 224.

Then, the gate insulation layer pattern 230, the gate electrode 240, and the gate mask 250 may sequentially fill the trench 225. The gate insulation layer pattern 230, the gate electrode 240 and the gate mask 250 may extend in the second direction.

The gate insulation layer pattern 230, the gate electrode 240, the gate mask 250, and the impurity regions of the active pattern 220 may constitute a transistor. For example, the transistor may be a buried channel array transistor (BCAT) having the gate electrode 240 buried at an upper portion of the substrate 200.

Figure 26:
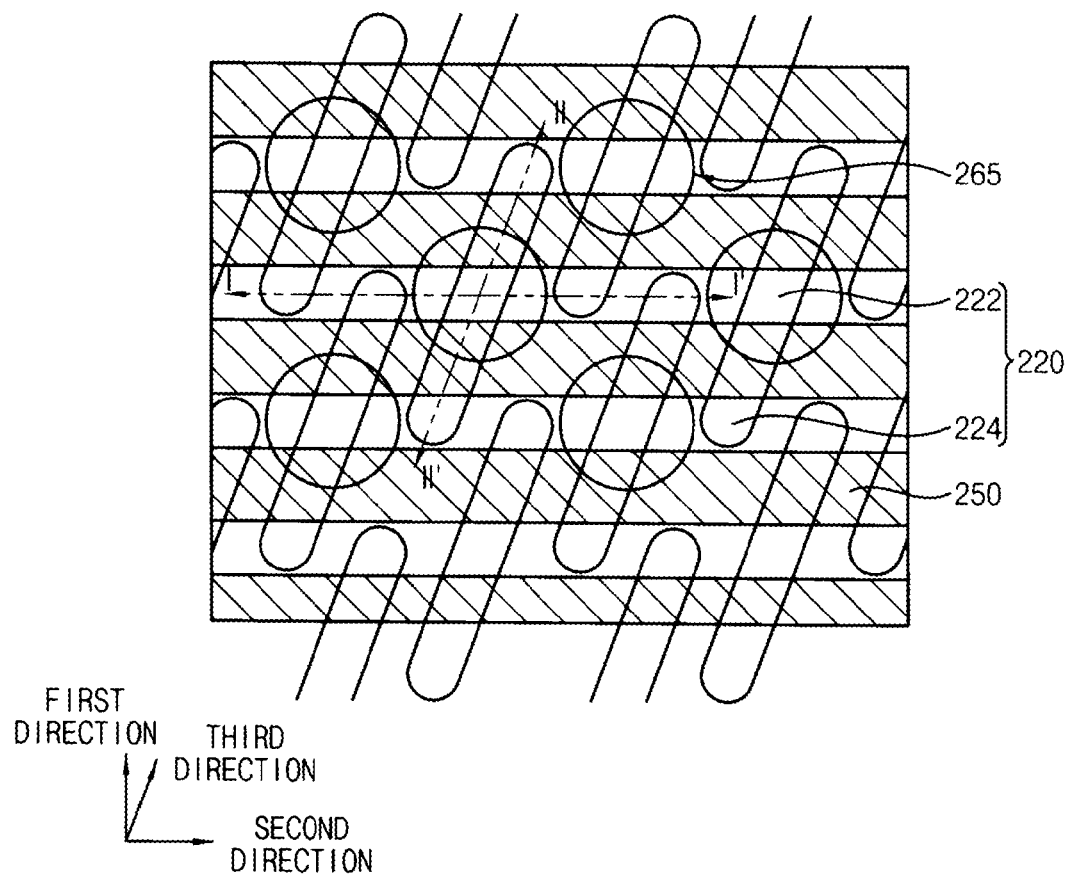
Figure 27:
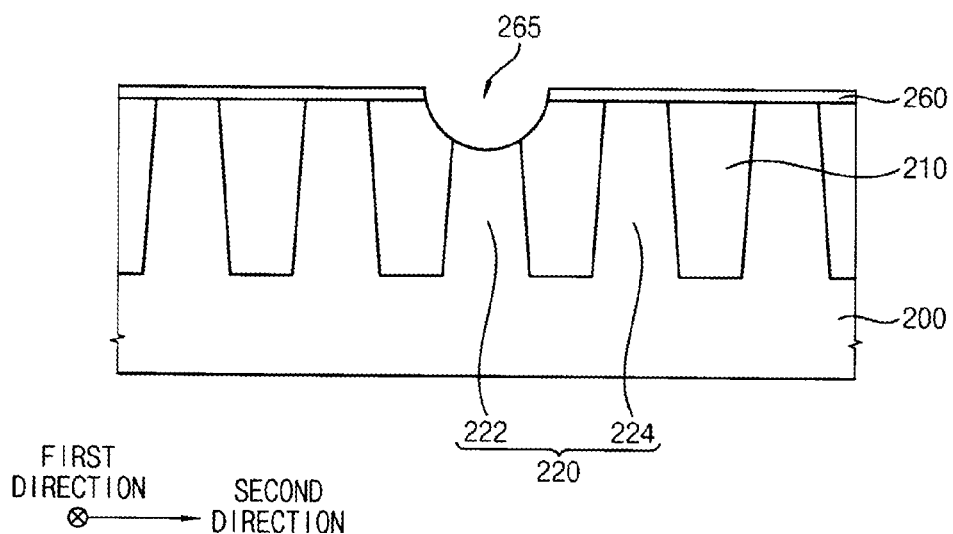

Referring to FIGS. 26 and 27, a first insulating interlayer 260 may be formed on the substrate 200, the isolation layer 210, the gate insulation layer pattern 230 and the gate mask 250. Then, a first recess 265 may be formed to expose the first region 222 of the active pattern 220.

For example, the first insulating interlayer 260 may include an insulation material, e.g., silicon oxide.

Then, the first insulating interlayer 260, the substrate 200 and the isolation layer 210 may be partially removed by an etching process, thereby forming the first recess 265. In example embodiments, the first recess 265 may be disposed to overlap the first region 222 of the active pattern 220. For example, the first recess 265 may sufficiently expose the first region 222 of the active pattern 220.

Figure 28:
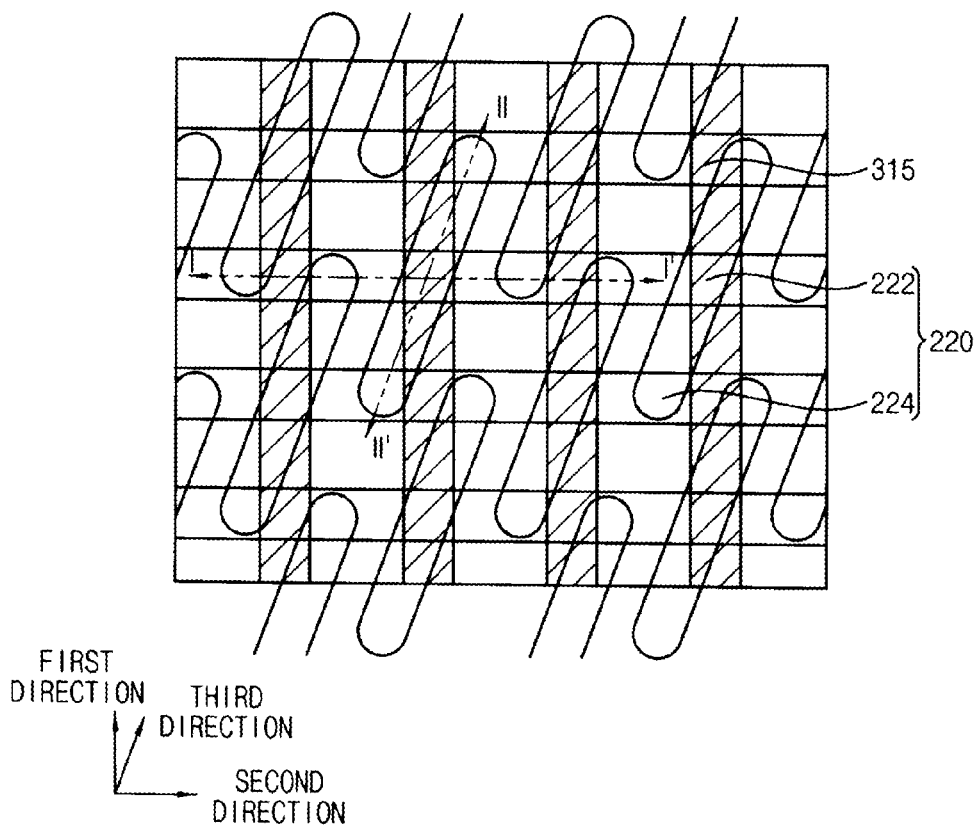
Figure 29:
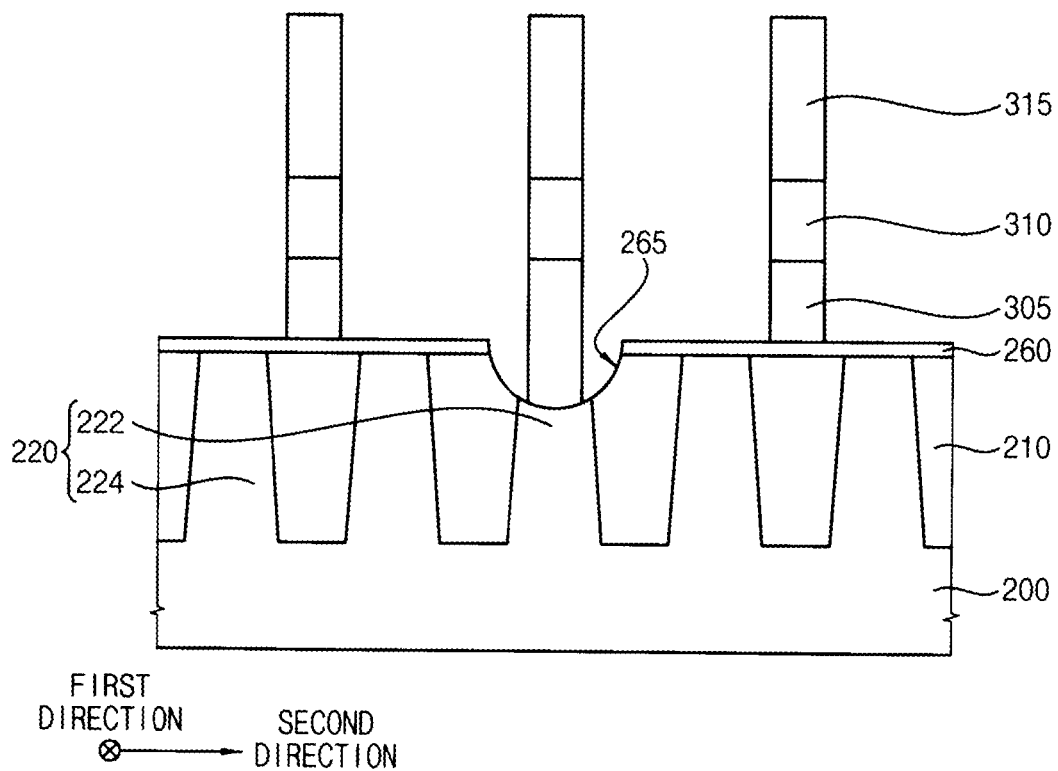

Referring to FIGS. 28 and 29, a first contact 305, a first conductive pattern 310 and a hardmask 315 may be formed on the substrate 200 and the first insulating interlayer 260.

A first conductive layer, a second conductive layer and a hardmask layer may formed on the substrate 200 and the first insulating interlayer 260 to fill the first recess 265, and then the first conductive layer, the second conductive layer and the hardmask layer may be patterned to form the first contact 305, the first conductive pattern 310 and the hardmask 315.

The first contact 305 and the first conductive pattern 310 may include, e.g., a doped polysilicon, a metal, or a metal nitride. For example, the first contact 305 may include the doped polysilicon, and the first conductive pattern 310 may include a metal, e.g., tungsten. For example, the hardmask 315 may include a nitride, e.g., as silicon nitride.

In example embodiments, a plurality of first conductive patterns 310 and a plurality of hardmasks 315 may be arranged in the second direction. Each of the first conductive patterns 310 and each of the hardmasks 315 may extend in the first direction. Further, the first contact 305 may electrically connect the first conductive pattern 310 with the active pattern 220 (e.g., the first region 222). The first conductive pattern 310 may serve as a bit line of the semiconductor device, and the first contact 305 may serve as a bit line contact of the semiconductor device.

Figure 30:
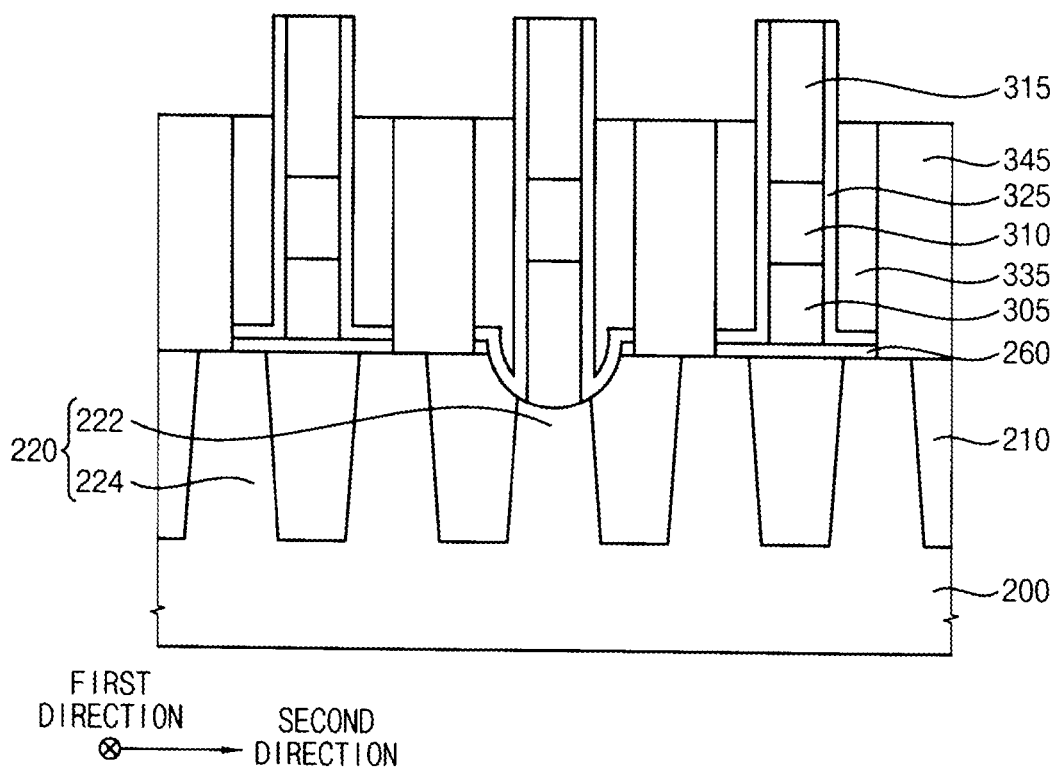

Referring to FIG. 30, processes substantially the same as or similar to those illustrated with reference to FIGS. 3 to 6 may be performed.

For example, after forming a first spacer layer and a first sacrificial layer, the first spacer layer and the first sacrificial layer may be partially removed to form a first spacer 325 and a preliminary first sacrificial layer pattern. A second sacrificial layer pattern 345 may be formed, and then a portion of the preliminary first sacrificial layer pattern which is exposed by the second sacrificial layer pattern 345 may be removed to form a first sacrificial layer pattern 335.

The first sacrificial layer pattern 335 may have a top surface, which may be substantially higher than a top surface of the first conductive pattern 310, and may be substantially lower than a top surface of the first spacer 325.

Figure 31:
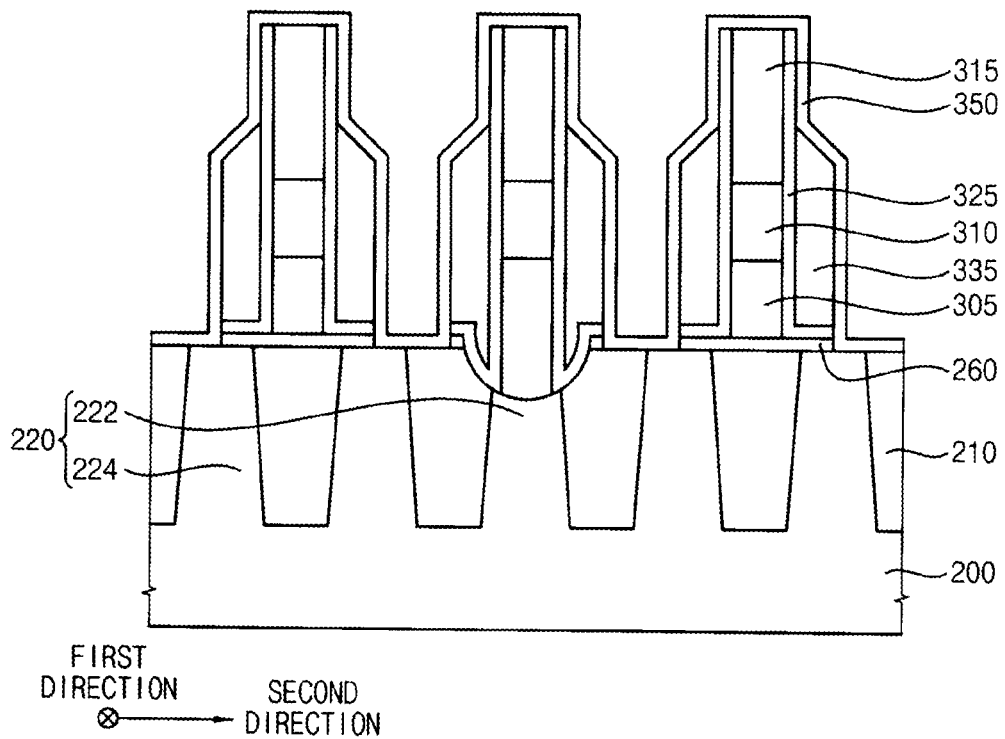

Referring to FIG. 31, after removing the second sacrificial layer pattern 345, a second spacer layer 350 may be formed on the substrate 200 to cover the hardmask 315, the first spacer 325 and the first sacrificial layer pattern 335.

The second spacer layer 350 may be conformally formed on the top surface of the substrate 200, a top surface and a sidewall of the first sacrificial layer pattern 335, the top surface and a sidewall of the first spacer 325 and a top surface of the hardmask 315, and may include a material substantially the same as that of the first spacer 325. For example, the second spacer layer 350 may include silicon nitride.

Figure 32:
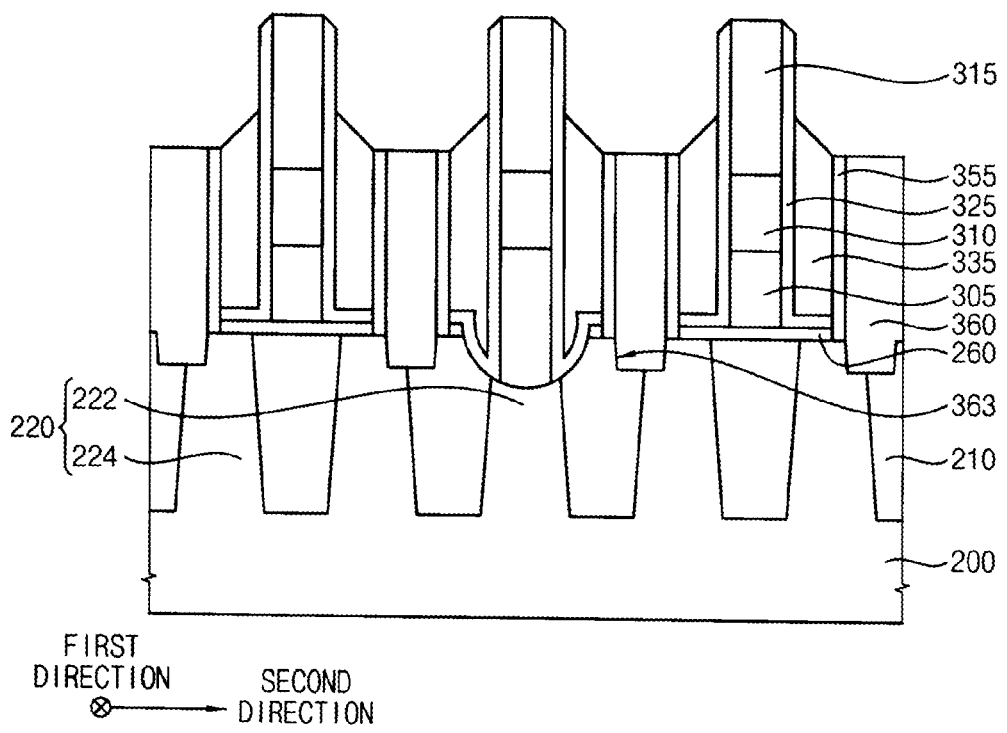

Referring to FIG. 32, after forming a second spacer 355 by partially removing the second spacer layer 350, a second recess 363 may be formed to expose the second region 224 of the active pattern 220, and a second conductive pattern 360 may fill the second recess 363.

In example embodiments, some portions of the second spacer layer 350 on the substrate 200 and the top surface of the hardmask 315 may be removed by using an etching process. The etching process may be an anisotropic etching process. Thus, other portions of the second spacer layer 350 on and the first sacrificial layer pattern 335 and/or on the sidewall of the first spacer 325 may remain (e.g., may not be completely removed), thereby defining the second spacer 355. Therefore, the second spacer 355 may have a top surface substantially lower than the top surface of the first spacer 325.

Then, the substrate 200 and the isolation layer 210 may be partially removed to form the second recess 363.

Figure 33:
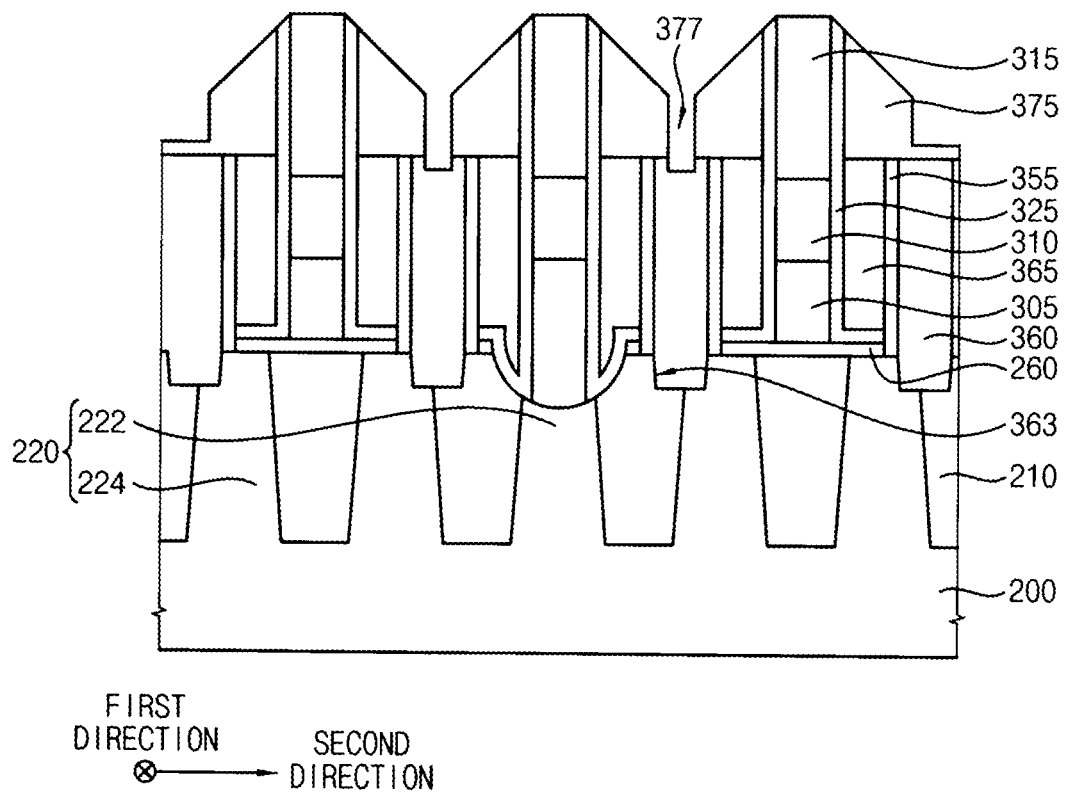

Referring to FIG. 33, processes substantially the same as or similar to those illustrated with reference to FIGS. 10 to 12 may be performed.

For example, an air gap 365 may be formed between the first spacer 325 and the second spacer 355 by removing the first sacrificial layer pattern 335, and a third spacer 375 may be formed to cover or enclose the air gap 365. For example, the second conductive pattern 360 may be exposed by a third recess 377 between the third spacers 375.

Figure 34:
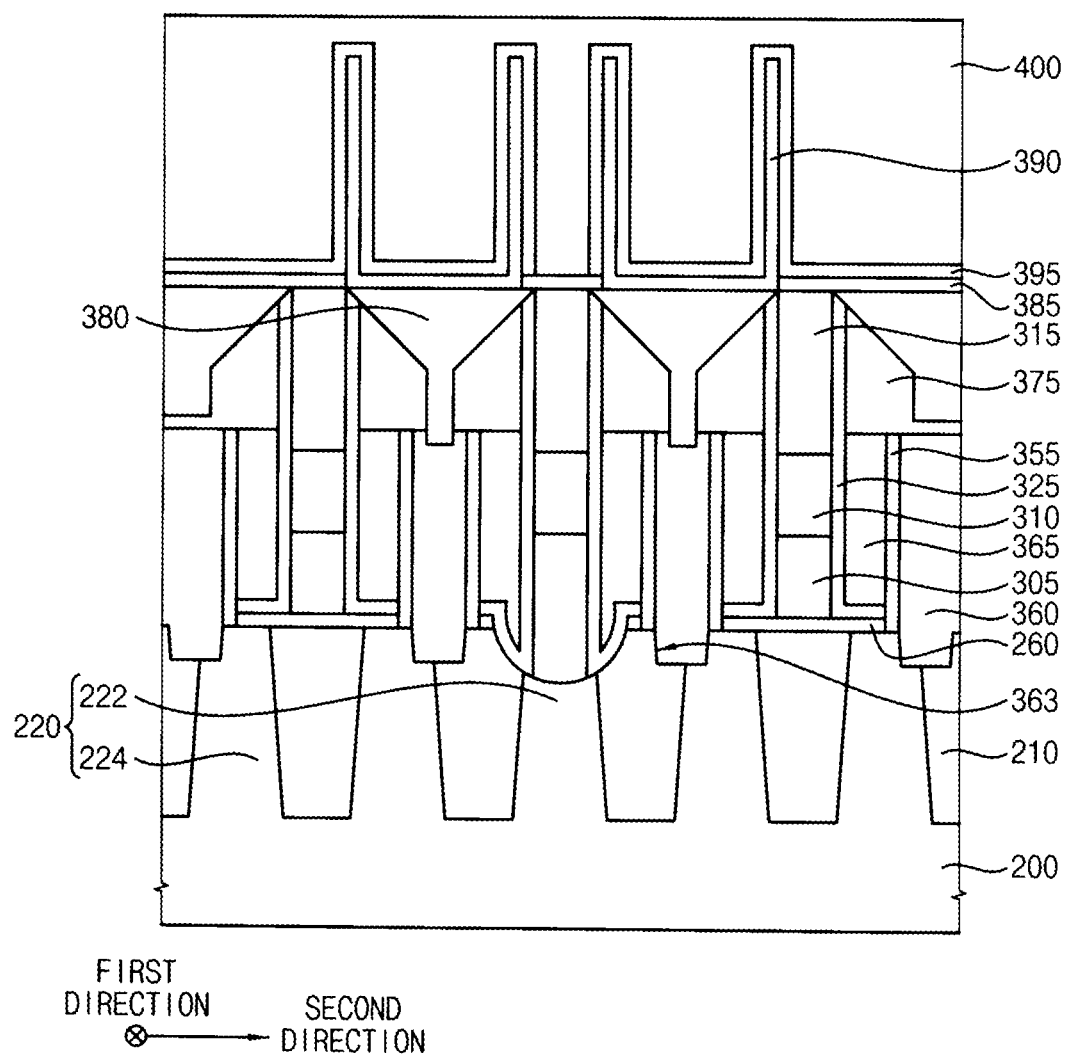

Referring to FIG. 34, after forming a third conductive pattern 380 filling the third recess 377, a capacitor may be formed on the third conductive pattern 380.

A conductive layer may be formed on the first spacer 325, the third spacer 375, and the second conductive pattern 360 to fill the third recess 377, and then an upper portion of the conductive layer may be planarized by an etch back process and/or a CMP process to form the third conductive pattern 380. The second conductive pattern 360 and the third conductive pattern 380 may serve as a capacitor contact which may connect a capacitor with the second region 224 of the active pattern 220.

In example embodiment, a second insulating interlayer (not illustrated) may be disposed on the third spacer 375, and the third conductive pattern may be disposed through the second insulating interlayer.

Then, the capacitor may be formed to include a lower electrode 390, a dielectric layer 395 and an upper electrode 400.

In example embodiments, an etch stop layer 385 and a third insulating interlayer (not illustrated) may be formed on the second insulating interlayer and the third conductive pattern 380, and portions of the etch stop layer 385 and the third insulating interlayer may be removed to form an opening exposing the third conductive pattern 380. A lower electrode layer may be formed on an inner wall of the opening and the third insulating interlayer, and an upper portion of the lower electrode layer may be removed to form the lower electrode 390. Then, the third insulating interlayer may be removed by using an etching process.

The dielectric layer 395 including a high dielectric material having a dielectric constant substantially higher than that of silicon oxide or silicon nitride may be formed. For example, the high dielectric material may include, e.g., tantalum oxide, hafnium oxide, aluminum oxide, zirconium oxide, etc. The high dielectric material may be used alone, or may be used as a mixture thereof.

The upper electrode 400 may be formed by using a CVD process, a PVD process, an ALD process, etc., and may include, e.g., a metal, a metal nitride or doped polysilicon. The upper electrode 400 may be a cylinder type or may be a thin film type.

In example embodiments, the first spacer 325, the second spacer 355 and the third spacer 375 may be formed by using processes substantially the same as or similar to those illustrated with reference to FIGS. 2 to 12. However, example embodiments are not limited thereto. For example, the first spacer 325, the second spacer 355 and the third spacer 375 may be formed by processes substantially the same as or similar to those illustrated with reference to FIGS. 13 to 17 or FIGS. 18 to 20.

According to example embodiments, the air gap 365 may be defined by the sidewall of the first spacer 325, the sidewall of the second spacer 355 and a bottom surface of the third spacer 375. The first spacer 325 and the second spacer 355 may have different height, and the third spacer 375 may have a height corresponding to the difference between heights of the first spacer 325 and the second spacer 355. Therefore, the third spacer 375 may have a sufficient height. Thus, a portion of the third spacer 375 above the air gap 365 may not be easily damaged or broken.

Figure 35:
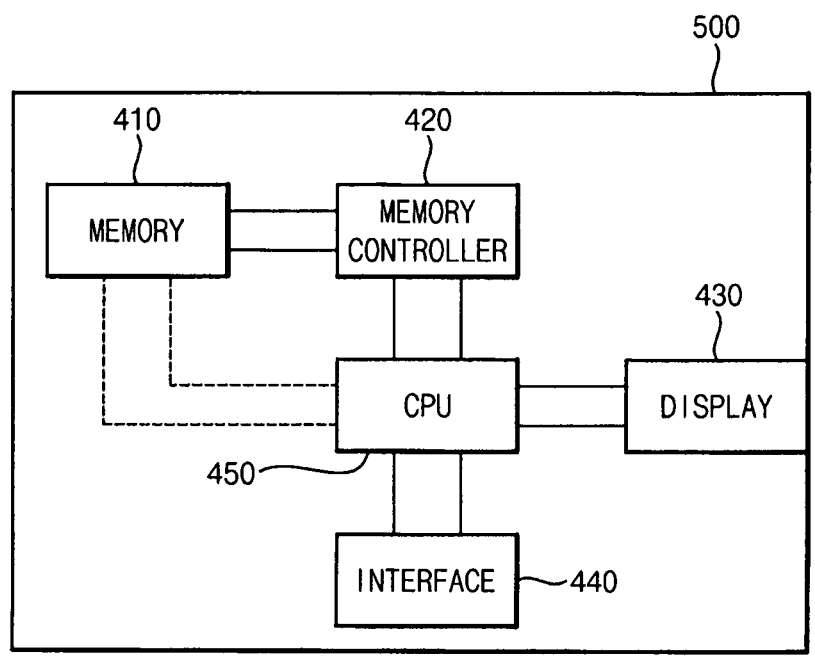

FIG. 35 is a block diagram illustrating a system including the semiconductor device manufactured according to example embodiments.

Referring to FIG. 35, a system 500 may include a memory 410, a memory controller 420 controlling the operation of the memory 410, displaying part 430 outputting information, an interface 440 receiving information, and a main processor 450 controlling the above described parts. The memory 410 may be a semiconductor device in accordance with example embodiments. The memory 410 may be directly connected or indirectly connected through a bus to the main processor 450. The system 500 may be applied to, e.g., a computer, a portable computer, a laptop computer, a personal portable terminal, a tablet, a cellular phone, a digital music player, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a wiring structure, comprising:
   forming a first conductive pattern on a substrate;
   forming a hardmask on the first conductive pattern;
   forming a first spacer on sidewalls of the first conductive pattern and the hardmask, the first spacer having a top surface substantially higher than a top surface of the first conductive pattern;
   forming a first sacrificial layer pattern on a sidewall of the first spacer;
   performing a first anisotropic etching process on the first sacrificial layer to expose an upper surface of the substrate;
   forming a second sacrificial layer on the first sacrificial layer and the upper surface of the substrate;
   partially removing upper portions of the first sacrificial layer and the second sacrificial layer to form a first sacrificial layer pattern and a second sacrificial layer pattern, respectively;
   removing the second sacrificial layer pattern to expose the upper surface of the substrate;
   forming, by performing a second anisotropic etching process, a second spacer on a sidewall of the first sacrificial layer pattern, while exposing the upper surface of the substrate, the second spacer having a top surface substantially lower than the top surface of the first spacer;
   removing the first sacrificial layer pattern; and
   forming a third spacer on the second spacer, the third spacer contacting an upper portion of the sidewall of the first spacer and defining an air gap in association with the first and second spacers.

2. The method of claim 1, wherein the second sacrificial layer pattern includes a material having an etch selectivity with respect to the first spacer and the first sacrificial layer pattern.

3. The method of claim 1, wherein forming the second spacer comprises:
   forming a second spacer layer on a top surface and the sidewall of the first sacrificial layer pattern; and
   removing a portion of the second spacer layer on the top surface of the first sacrificial layer pattern.

4. The method of claim 1, wherein forming the second spacer further comprises:
forming a second spacer layer on the sidewall of the first sacrificial layer pattern;
forming a second conductive pattern covering a lower portion of a sidewall of the second spacer layer; and
removing a portion of the second spacer layer exposed by the second conductive pattern.

5. The method of claim 4, wherein removing the portion of the second spacer layer and removing the first sacrificial layer pattern are performed simultaneously.

6. The method of claim 1, wherein the first sacrificial layer pattern includes a material having an etch selectivity with respect to the first spacer and the second spacer.

7. The method of claim 1, wherein a height of the first spacer is substantially equal to a sum of heights of the second spacer and the third spacer.

8. A method of manufacturing a semiconductor device, comprising:
forming a gate insulation layer pattern and a gate electrode extending in a first direction substantially parallel to a top surface of a substrate, the gate insulation layer pattern and the gate electrode buried at an upper portion of the substrate;
forming a first conductive pattern on the substrate, the first conductive pattern extending in a second direction substantially perpendicular to the first direction;
forming a hardmask on the first conductive pattern;
forming a first spacer on sidewalls of the first conductive pattern and the hardmask, the first spacer having a top surface substantially higher than a top surface of the first conductive pattern and including silicon nitride;
forming a first sacrificial layer pattern on a sidewall of the first spacer;
forming a second spacer on a sidewall of the first sacrificial layer pattern, the second spacer having a top surface substantially lower than the top surface of the first spacer and including silicon nitride;
removing the first sacrificial layer pattern; and
forming a third spacer on the second spacer, the third spacer contacting an upper portion of the sidewall of the first spacer and defining an air gap in association with the first and second spacers, and the third spacer including silicon nitride.

9. The method of claim 8, wherein
forming the first sacrificial layer pattern comprises,
forming a preliminary first sacrificial layer pattern on the sidewall of the first spacer,
forming a second sacrificial layer pattern covering a lower portion of a sidewall of the preliminary first sacrificial layer pattern, and
removing a portion of the preliminary first sacrificial layer pattern exposed by the second sacrificial layer pattern, and
forming the second spacer comprises,
forming a second spacer layer on a top surface and the sidewall of the first sacrificial layer pattern, and
removing a portion of the second spacer layer on the top surface of the first sacrificial layer pattern.

10. The method of claim 8, wherein forming the second spacer comprises:
forming a second spacer layer on the sidewall of the first sacrificial layer pattern;
forming a second conductive pattern covering a lower portion of a sidewall of the second spacer layer; and
removing a portion of the second spacer layer exposed by the second conductive pattern.

11. The method of claim 8, further comprising:
forming a second conductive pattern filling a space between the second spacers before defining the air gap; and
forming a capacitor electrically connected to the second conductive pattern after forming the third spacer.

12. A method of manufacturing a wiring structure, comprising:
forming a first conductive pattern on a substrate;
forming a hardmask on the first conductive pattern;
forming a first spacer on sidewalls of the first conductive pattern and the hardmask, the first spacer having a top surface substantially higher than a top surface of the first conductive pattern and including silicon nitride;
forming a second spacer spaced apart from the first spacer, the second spacer having a top surface substantially lower than the top surface of the first spacer and including silicon nitride; and
forming a third spacer on the second spacer to define an air gap enclosed by the first, second, and third spacers on the substrate, the third spacer including silicon nitride.

13. The method of claim 12, wherein forming the third spacer forms the third spacer to contact an upper portion of the sidewall of the first spacer.

14. The method of claim 12, wherein forming the third spacer defines the air gap enclosed by a sidewall of the first spacer, a sidewall of the second spacer, a bottom surface of the third spacer.

15. The method of claim 12, wherein forming the third spacer defines the air gap enclosed by a sidewall of the first spacer, a sidewall of the second spacer, a bottom surface of the third spacer, and an upper surface of the substrate.

16. The method of claim 12, wherein forming the third spacer forms the third spacer having a height substantially corresponding to a difference between heights of the first spacer and the second spacer.

* * * * *